(12) United States Patent
Inaba et al.

(10) Patent No.: US 7,352,143 B2
(45) Date of Patent: Apr. 1, 2008

(54) INTERFACE CIRCUIT, POWER CONVERSION DEVICE, AND VEHICLE-MOUNTED ELECTRIC MACHINERY SYSTEM

(75) Inventors: Masamitsu Inaba, Chiyoda-ku (JP); Masahiro Iwamura, Chiyoda-ku (JP); Satoru Shigeta, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/349,901

(22) Filed: Feb. 9, 2006

(65) Prior Publication Data

US 2006/0198072 A1    Sep. 7, 2006

(30) Foreign Application Priority Data

Feb. 10, 2005    (JP) .............................. 2005-034848

(51) Int. Cl.
*H02P 1/00* (2006.01)
(52) U.S. Cl. ...................... 318/139; 318/254; 318/138; 318/439
(58) Field of Classification Search ................ 318/139, 318/254, 138, 439, 800, 106; 327/108, 109; 360/46
See application file for complete search history.

(56) References Cited

U.S. PATENT DOCUMENTS

| 5,796,277 A | 8/1998 | Kim et al. |
| 5,910,716 A | 6/1999 | Olsen et al. |
| 2006/0006832 A1* | 1/2006 | Kitajima et al. ............ 318/800 |

FOREIGN PATENT DOCUMENTS

| JP | 60-74788 A | 4/1985 |
| JP | 9-46145 A | 2/1997 |
| JP | 2001-217697 A | 8/2001 |
| JP | 2001-245466 A | 9/2001 |
| JP | 2004-173413 A | 6/2004 |
| JP | 2004-265931 A | 9/2004 |
| JP | 2005-197377 A | 7/2005 |
| WO | WO 2004/047297 A1 | 6/2004 |

OTHER PUBLICATIONS

European Search Report dated Oct. 9, 2006. (Three (3) pages).

* cited by examiner

*Primary Examiner*—Karen Masih
(74) *Attorney, Agent, or Firm*—Crowell & Moring LLP

(57) ABSTRACT

An interface circuit capable of reliably transmitting signal even when there is fluctuation in the potential difference in reference potentials between circuits between which signal transmission is carried out. An interface circuit 4 is comprised of a level shift circuit 20 and a potential selection circuit 10 for selecting the potential of a power supply voltage for operating the level shift circuit 20. The potential selection circuit 10 selects one of a plurality of input potentials. The level shift circuit 20 receives a voltage pulse having a first potential as reference potential and outputs a voltage pulse having a second potential as reference potential. The level shift circuit 20 is operated on the basis of both a potential difference between the output potential from the potential selection circuit and the first potential and a potential difference between the selected potential and the second potential.

19 Claims, 9 Drawing Sheets

INTERFACE CIRCUIT, POWER CONVERSION DEVICE, AND VEHICLE-MOUNTED ELECTRIC MACHINERY SYSTEM

BACKGROUND OF THE INVENTION

1. Field of the Invention

The present invention relates to an interface circuit used for signal transmission between circuits having different reference potentials. It also relates to a power conversion device and a vehicle-mounted electric machinery system.

2. Background Art

An example of conventional interface circuits is disclosed in Patent Document 1. This conventional interface circuit includes a current source and a resistor, wherein a pulse signal inputted from a circuit with a first reference potential is transmitted as a pulse signal having a second reference potential different from the 1st potential by switching the direction of current through the resistor. In this way, signal transmission between circuits with different reference potentials is carried out without employing any externally attached components such as an optical isolator.

Patent Document 1: JP Patent Publication (Kokai) No. 9-46145 A (1997)

SUMMARY OF THE INVENTION

In power conversion devices, such as vehicle-mounted inverters, signal transmission is carried out between circuits having different reference potentials. Therefore, the circuits with different reference potentials must be electrically insulated. For such electrical insulation, an optical isolator is usually employed. Optical isolators, however, consumes large amounts of power, deteriorate greatly with age, and have a narrow operating temperature range. Thus, there is a need for a means for allowing signal transmission between circuits with different reference potentials without using an optical isolator in vehicle-mounted inventors, which are required to have a long life of 15 years and be capable of operating in a temperature environment ranging from −40° C. to 150° C.

Furthermore, optical isolators cannot be formed on a silicon substrate as an integrated circuit (IC) and must be mounted on a printed-circuit board as an externally attached component when it is mounted within a vehicle-mounted inverter. Thus, there is a need for a means that enables signal transmission between circuits with different reference potentials and which contributes to the reduction in size of the device without using an optical isolator in a vehicle-mounted inverter, which is mounted within a limited space in the vehicle.

Conventional interface circuits are capable of allowing signal transmission between circuits with different reference potentials without using an optical isolator.

However, in the conventional interface circuits, no consideration has been given to the fact that the reference potential difference between the circuits between which signal transmission is carried out is subject to large variation due to the influence of noise or the like.

In one major aspect, the invention provides an interface circuit capable of reliably transmitting signals even when there is fluctuation in reference potential difference between circuits between which signal transmission is carried out.

The most representative feature of the invention lies in an interface circuit comprising a potential selection circuit for selecting one of a plurality of input potentials and a level shift circuit to which a voltage pulse having a first potential as reference potential is inputted and which outputs a voltage pulse having a second potential as reference potential. The level shift circuit is operated on the basis of both a potential difference between the output potential from the potential selection circuit and the first potential and on the basis of a potential difference between the selected potential and the second potential.

The invention also provides a power conversion device that employs the aforementioned interface circuit as a signal transmission means between a control unit for outputting a control signal for operating a switching semiconductor device in a conversion unit and a drive unit for outputting, in response to a control signal from the control unit, a drive signal for driving the switching semiconductor device in the conversion unit.

The invention also provides a vehicle-mounted electric machinery system comprising the aforementioned power conversion device as a control unit for controlling a vehicle-mounted rotating electrical machine by feeding it with a predetermined electric power from a vehicle-mounted power supply.

In accordance with the invention, signals can be reliably transmitted even when there is fluctuation in the potential difference in reference potentials between circuits transmitting signals to each other. Thus, the invention can provide a highly noise-tolerant, highly reliable, and highly heat-resistant interface circuit.

Furthermore, the invention can provide a power conversion device equipped with the aforementioned interface circuit disposed between a control unit and a drive unit.

Furthermore, the invention can provide a vehicle-mounted electric machinery system equipped with the aforementioned power conversion device as a control unit for a vehicle-mounted rotating electrical machine.

DESCRIPTION OF PREFERRED EMBODIMENTS

Figure 1:
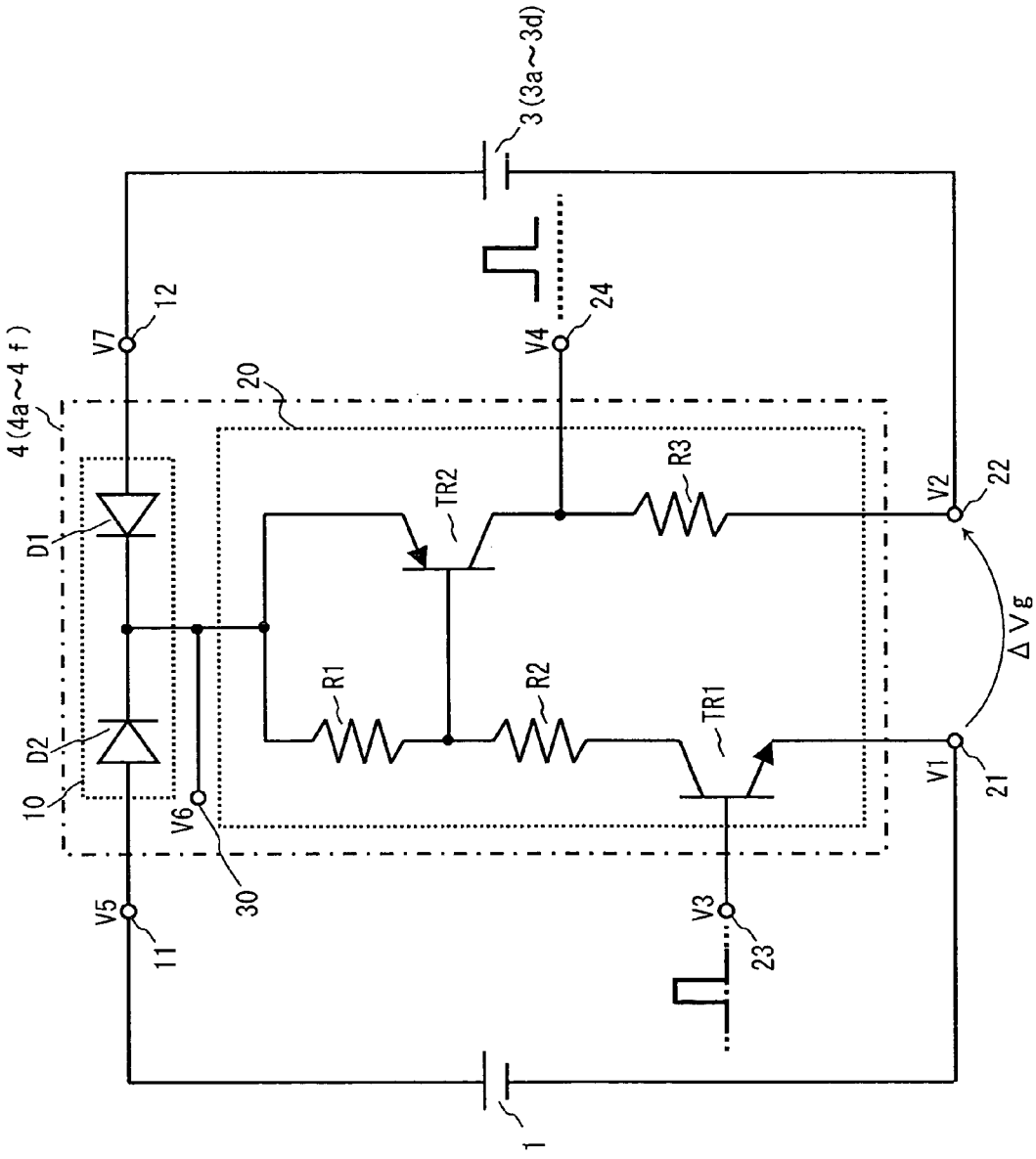
FIG. 1 shows a circuit diagram of a driving interface circuit according to a first embodiment of the invention.

In the following, embodiments of the invention will be described with reference to the drawings. The embodiments refers to a vehicle-mounted inverter as an example of the power conversion device to which an interface circuit according to the invention is applied. The vehicle-mounted inverter, which is used for controlling the driving of a vehicle-mounted electric motor, converts DC power fed from a vehicle-mounted battery, which constitutes a vehicle-mounted power supply, into AC power, and feeds it to the vehicle-mounted electric motor.

The structure or configurations described below can also be applied to DC/DC power conversion devices, such as DC/DC converters and DC choppers. They can also be applied to power conversion devices for industrial and household purposes.

A first embodiment of the invention will be described with reference to FIGS. 1 to 6. Initially, the structure and operation of a vehicle according to the embodiment will be described with reference to FIG. 6, which schematically shows the structure of a power system of the vehicle of the embodiment.

The illustrated vehicle is a hybrid electric vehicle (to be hereafter referred to as an "HEV"), which is a type of electric vehicles. The HEV is equipped with two power systems. One is an engine system including an internal combustion engine ENG as a power source. The engine system is used mainly as a drive source for the HEV. The other is an electric machinery system including a motor generator M/G as a power source. The electric machinery system is used mainly as a start source and an assist source for the engine ENG, and as an electric power generating source for the HEV.

The HEV of the embodiment is capable of idle-stop operation (to be hereafter referred to as "IS operation") of the engine ENG. The IS operation is a mode of operation in which the operation of the engine ENG is terminated while the ignition key switch is on, when stopping at a red light or the like, and then the engine ENG is restarted when the vehicle is moved again.

In the front portion of the vehicle body (not shown), a front drive shaft FDS is rotatably bearing-supported. At either end of the front drive shaft FDS, there is mounted a pair of front wheels FLW and FRW. In the rear portion of the vehicle, which is not shown, a rear drive shaft is also rotatably bearing-mounted, with a pair of rear wheels mounted at either end thereof.

The HEV of the embodiment is of the front-wheel drive system. For this reason, differential gears DEF are mounted at the center of the front drive shaft FDS. The output side of the differential gears DEF is mechanically coupled to the front drive shaft FDS. The input side of the differential gears DEF is mechanically coupled to the output side of a transmission T/M. The differential gears DEF constitute a power distributing mechanism for distributing the rotating driving force transmitted from the transmission T/M to the left and right portions of the front drive shaft FDS. The transmission T/M is a power transmitting mechanism for transmitting the rotating driving force transmitted thereto to the differential gears DEF while allowing the speed of rotation to be changed. The rotating driving force transmitted to the transmission T/M is provided by the engine ENG and the motor generator M/G.

The engine ENG is fitted with a plurality of components, including injectors, throttle valves, ignition devices, and intake/exhaust valves (all of which are not shown). The injectors are fuel injection valves for controlling the amount of fuel injected into the cylinders of the engine ENG. The throttle valves control the volume of air supplied into the cylinders of the engine ENG. The ignition devices constitute a source of fire that is used for causing combustion of mixture gas in the cylinders of the engine ENG. The intake/exhaust valves are open/close valves mounted on the intake and exhaust sides of the cylinders of the engine ENG. Their open/close timings are controlled in accordance with the operating cycle of the engine ENG.

The individual components are controlled by an engine control unit ECU, which calculates control signals (control values) for operating each component based on instruction signals (values) outputted by higher-level control equipment, output signals (various parameter values) outputted by a variety of sensors and other control units, and data as well as maps that are stored in a memory unit in advance. The thus calculated control signals (control values) are outputted to the drive unit for each component, whereby the operation of each component is controlled so as to control the operation of the engine ENG.

The transmission T/M is equipped with a speed-change mechanism comprised of a plurality of gears. The transmission T/M provides a plurality of gear ratios by changing the routes of transmission gears for transmitting rotating driving force from the input shaft to the output shaft depending on the operating condition of the vehicle. The speed-change mechanism is controlled by a transmission controller unit TCU, which calculates a control signal (control value) for operating the speed-change mechanism based on an instruction signal (instruction value) outputted by higher-level control equipment, output signals (various parameter values) outputted by various sensors and other control units, and the data and maps that are stored in the memory unit in advance. The thus calculated control signals (control values) are outputted to a speed-change mechanism drive unit, whereby the operation of the speed-change mechanism is controlled and therefore the operation of the transmission T/M is also controlled.

In the HEV of the embodiment, a pulley EPU mounted on the crankshaft of the engine ENG is mechanically coupled with a pulley MPU mounted on the rotating shaft of the motor generator M/G via a belt BEL. Thus, the engine ENG and the motor generator M/G are mechanically coupled to each other. Thus, in accordance with the HEV of the embodiment, the rotating driving force from the motor generator M/G can be transmitted to the engine ENG, while the rotating driving force from the engine ENG can be transmitted to the motor generator M/G.

Figure 3:
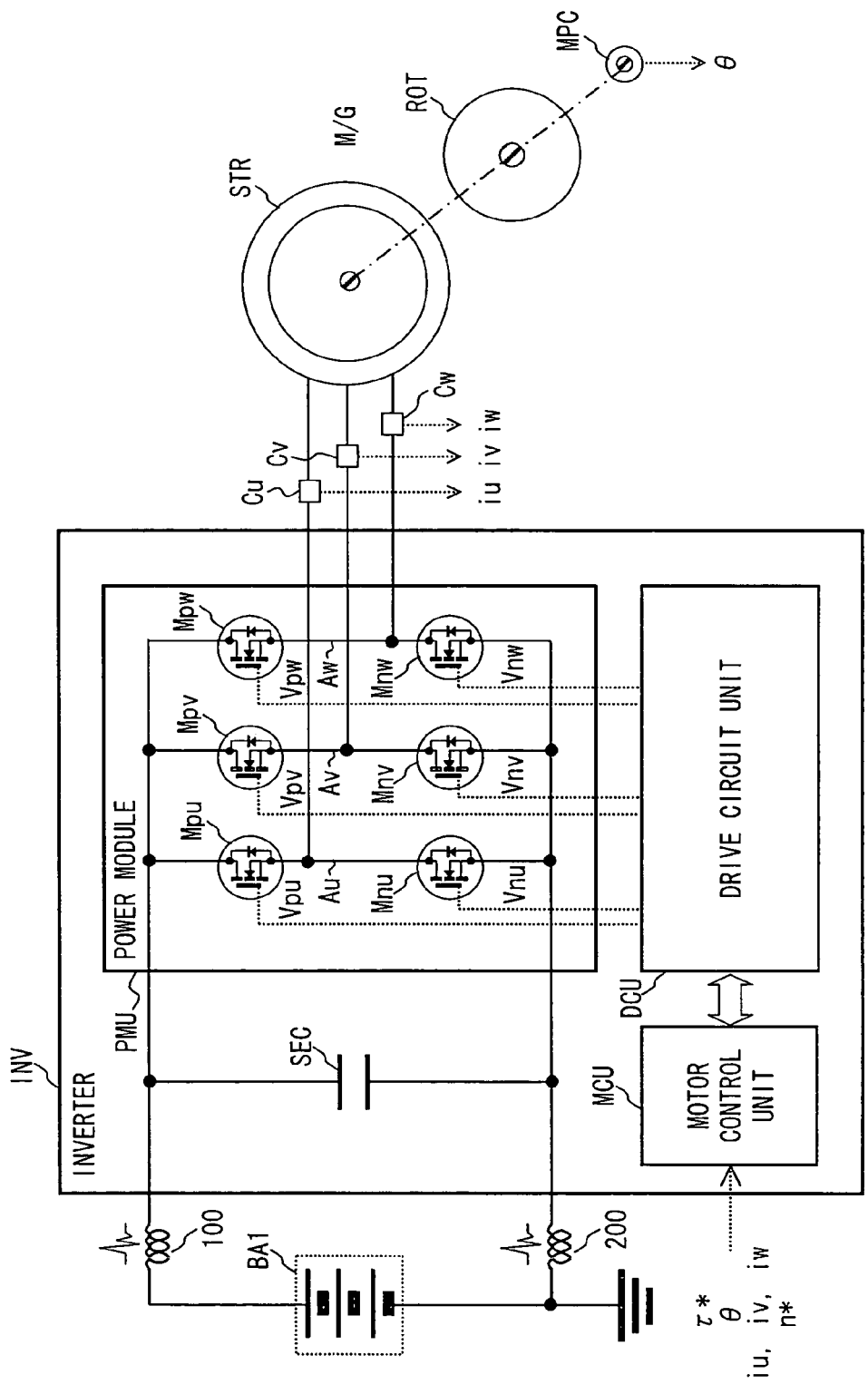
FIG. 3 shows a block diagram showing the configuration of a vehicle-mounted electric machinery system (an electric motor driving system comprised of a battery, an inverter unit, and a motor generator) according to the first embodiment of the invention, and a circuit diagram of a power module in the inverter unit.

The motor generator M/G is a permanent-magnet, alternating-current synchronous motor, and it has a stator STR and a rotor ROT, as shown in FIG. 3. The stator STR includes a stator core and stator coils. The stator core, which is cylindrical in shape, is a stacked iron core consisting of a plurality of rings of silicon steel plates (magnetic material) stacked in the axial direction. Along the inner periphery of the stator core, there are formed a plurality of slots in which the stator coils are housed. The stator coils are wound in either a distributed winding (in which two sides of the coils are housed in two slots separated by (striding over) several other slots), or in a concentrated winding (in which the coils are wound on teeth formed between adjacent slots, with two sides of the windings housed in the adjacent slots).

The rotor ROT is rotatably held on the internal peripheral side of the stator STR. The stator STR and the rotor ROT are oppositely disposed to each other via a gap such that their respective central axes are aligned. The rotor ROT includes a rotor core and permanent magnets. The rotor core is columnar in shape and is comprised of a stacked iron core formed by stacking a plurality of rings of silicon steel plates (magnetic material) in the axial direction. A rotating shaft is disposed axially through the center of the rotor core. On the outside of the rotor core, there are formed a plurality of magnet inserting openings in the direction of rotation at regular intervals, each opening extending in the axial direction. The magnet inserting openings have a rectangular cross section, with the longer-length direction of the cross section aligned with the direction of rotation and with the shorter-length direction aligned with the direction of diameter. The permanent magnets are cuboidal in shape and provide N- and S-pole rotating magnetic poles. They are embedded in the magnet inserting openings such that the entire peripheries of the magnets are covered with the rotor core.

The N-pole and S-pole permanent magnets are disposed alternately in the direction of rotation. Between adjacent permanent magnets (namely, between magnet inserting openings), there are formed auxiliary magnetic poles. Being core portions formed between magnet inserting openings, the auxiliary magnetic poles constitute a magnetic path along which magnetic fluxes for producing a reluctance torque flow. The length of the magnet inserting openings in the direction of rotation is greater than that of the permanent magnets in the direction of rotation. As a result, gaps are formed at either end of each permanent magnet in the direction of rotation when the permanent magnets are embedded in the magnet inserting openings. The gaps formed at either end of the permanent magnets in the rotating direction magnetically function to make gradual the transition of the distribution of magnetic flux density of the permanent magnets between the permanent magnets and the auxiliary magnetic poles.

The operation of the motor generator M/G is controlled by an inverter INV. Specifically, the inverter INV controls the three-phase AC power fed to the stator coil of the stator STR. Thus, the stator STR can produce a rotating magnetic field. The three-phase AC power fed to the stator coil is controlled by the inverter INV such that the composed vector of the magnetomotive forces of the stator STR produced by the current fed to the stator coils is advanced more toward the direction of rotation than the center of the magnetic poles of the auxiliary magnetic poles of the rotor ROT. As the rotating magnetic field is produced in the stator STR, a torque is produced by the magnetic flux of the permanent magnets and a reluctance torque is produced by the magnetic flux that passes through the auxiliary magnetic poles in the rotor ROT. As a result, a rotating driving force is produced in the rotor ROT commensurate with the three-phase AC power. In other words, the motor generator M/G can operate as an electric motor.

The motor generator M/G operates as an electric generator based on the rotating driving force provided by the engine ENG. In this case, the rotor ROT is rotated by the rotating driving force from the engine ENG. As the rotor ROT rotates, the magnetic flux of the permanent magnets interlinks with the stator coils, whereby an electromotive force is produced in the stator coils. As a result, a three-phase AC power is produced in the stator STR in accordance with the number of rotations of the rotor ROT. Thus, the motor generator M/G can operate as a generator. The thus produced three-phase AC power is fed to the inverter INV, which converts the three-phase AC power into DC power. The converted DC power is fed to a high-voltage battery BA1 to charge the same.

The motor generator M/G may be comprised of an AC synchronous motor with a Lundell type rotor or an AC induction motor with a cage rotor.

A Lundell type rotor has a magnetic pole core in which claw-like N- and S-magnetic poles are alternately disposed in the direction of rotation. The magnetic core has a field winding wound thereon which is an excitation winding for magnetizing the claw-like magnetic poles and is electrically connected to a collector ring. The collector ring, which is an electrically conducting member to which current is fed from the outside, is disposed on the outer periphery of the rotating shaft of the magnetic pole core on one end thereof in the axial direction. The outer peripheral surface of the collector ring is in contact with brushes under pressure. The collector ring is thus in slidable and electrical contact with the contact surfaces of the brushes so that it can be fed with the field current via the brushes. The field current fed to the brushes is controlled by a voltage regulator which controls the field current in accordance with the switching operation of a switching semiconductor device such as a transistor. Specifically, the voltage regulator produces a drive signal in response to a control signal from a motor control unit in the inverter, and controls the switching operation (on/off) of the switching semiconductor device in accordance with the thus produced drive signal.

The cage rotor includes a rotor core consisting of a laminated core. A plurality of slots are formed on the periphery of the rotor core by punching through the periphery of the rotor core in the axial direction. In the multiple slots, secondary conductors are cast under pressure. The secondary conductors are conductive aluminum rods embedded in the multiple slots such that they protrude from either axial end of the rotor core in the axial direction. The axial ends of the multiple secondary conductors are mechanically connected by means of a short-circuit ring, which is an electrically conductive member made of copper. Thus, the multiple secondary conductors are electrically short-circuited to each other.

The inverter INV is a power conversion device for converting the DC power fed from the high-voltage battery BA1 into a three-phase AC power, and it includes a power module PMU, a drive circuit unit DCU, and a motor control unit MCU.

The power module PMU constitutes a main conversion circuit for the inverter INV and includes a plurality of power semiconductor devices. The motor control unit MCU constitutes a control unit for the inverter INV. It calculates a control signal (control value) for switching on and off the multiple power semiconductor devices based on instruction signals (instruction values) outputted by higher-level control equipment, output signals (various parameter values) from various sensors and other control devices, and data or maps that are stored in the memory unit in advance. The thus calculated control signals (control values) are outputted to the drive circuit unit DCU, which constitutes a drive unit for the inverter INV and produces a drive signal for switching the multiple power semiconductor devices in accordance with the control signals (control values) from the motor control unit MCU. The drive signal thus produced is outputted to the power module PMU.

In the inverter INV of the present embodiment, the power module PMU and the drive circuit unit DCU are combined to form an intelligent power module IPM.

The power supply for the hybrid vehicle of the present embodiment consists of two electric power supply systems. One consists of a high voltage (42 V) power supply, and the other consists of a low voltage (14 V) power supply. The high-voltage power supply, which includes a high-voltage battery BA1, is used for driving the motor generator M/G and several components of the engine ENG, such as the injectors, throttle valves, ignition devices, and intake/exhaust valves. The low-voltage power supply is used for driving a starter STR for starting the engine ENG, accessories such as a radio and lights, and control units including the engine control unit ECU, a transmission control unit TCU, the motor control unit MCU, a battery control unit BCU, and a general control unit GCU. The low-voltage power supply includes a low-voltage battery BA2.

The high-voltage battery BA1 is a lithium ion battery with a battery voltage of 36 V. Alternatively, the high-voltage battery BA1 may be a lead battery or a hydrogen-ion battery with the same battery voltage.

The low-voltage battery BA2 is a lead battery with a battery voltage of 12 V Alternatively, it may be a lithium ion battery or a hydrogen-ion battery with the same battery voltage.

The high-voltage battery BA1 (high-voltage power supply) is electrically connected to the input side (DC) of the inverter INV. Thus, the high-voltage battery BA1 (high-voltage power supply) and the inverter INV can exchange DC power between them. When the motor generator M/G is operated as an electric motor, the DC power stored in the high-voltage battery BA1 (high-voltage power supply) is fed to the inverter INV and converted into a three-phase AC power. When the motor generator M/G is operated as a generator, the DC power outputted from the inverter INV is fed to a high-voltage electric load as driving force and consumed therein and is also fed to the high-voltage battery BA1 for charging the same.

The low-voltage battery BA2 (low-voltage power supply) is electrically connected to the high-voltage battery BA1 (high-voltage power supply) via a bidirectional DC-DC converter DCC. Thus, the low-voltage battery BA2 (low-voltage power supply) and the high-voltage battery BA1 (high-voltage power supply) can exchange DC power between them by changing the voltage level. When a low-voltage electric load is to be fed with a low-voltage DC power, or when the low-voltage battery BA2 is charged, the DC power fed from the high-voltage battery BA1 (high-voltage power supply) is stepped down by the DC-DC converter DCC and then fed to the low-voltage battery BA2 (low-voltage power supply). When a backup of the high-voltage battery BA1 (high-voltage power supply) is needed, the DC power fed from the low-voltage battery BA2 (low-voltage power supply) is stepped up by the DC-DC converter DCC and then fed to the high-voltage battery BA1 (high-voltage power supply).

Charge and discharge of the high-voltage battery BA1 and the low-voltage battery BA2 are controlled by the battery control unit BCU, which also controls their life, for example. The battery control unit BCU is supplied with the voltage and current values or the like of the high-voltage battery BA1 and the low-voltage battery BA2 for controlling the charge and discharge of the individual batteries or managing their life.

The DC-DC converter DCC is equipped with a semiconductor module, a reactor, and a drive circuit unit (all of which are not shown). The semiconductor module constitutes a switching unit for a step-up/down circuit for the stepping up or down of the DC power of the DC-DC converter DCC and includes a plurality of switching semiconductor devices. The reactor, which is a magnetic element constituting an electromagnetic energy storage unit for the step-up/down circuit, is comprised of a magnetic core ring on which two coils are wound. The drive circuit unit constitutes a drive unit for the DC-DC converter DCC and it produces a drive signal for switching on and off the multiple switching semiconductor devices in accordance with a control signal (control value) outputted from a control unit (not shown). The drive signal is outputted to the power semiconductor devices in the module. The control unit that outputs the control signal to the drive circuit unit is built inside the DC-DC converter DCC or the battery control unit BCU.

The engine control unit ECU, transmission control unit TCU, motor control unit MCU, and battery control unit BCU are electrically connected to each other via a vehicle-mounted local area network LAN. They are also electrically connected to the general control unit GCU. Thus, signal transmission can be conducted bidirectionally among the individual control units, whereby they can mutually transmit information and share detected values or the like. The general control unit GCU outputs instruction signals to the individual control units in accordance with the operation state of the vehicle. For example, the general control unit GCU calculates a required torque value of the vehicle in accordance with the amount of depression of the accelerator pedal, which reflects the driver's acceleration demand. The general control unit GCU then distributes this torque value into an output torque value for the engine ENG and an output torque value for the motor generator M/G such that improved operation efficiency of the engine ENG can be achieved. The output torque value distributed to the engine ENG is outputted to the engine control unit ECU as an engine torque instruction signal. The output torque value distributed to the motor generator M/G is outputted to the motor control unit MCU as a motor torque instruction signal.

The HEV of the present embodiment is equipped with a plurality of drive modes. The operation of each of the two power systems is controlled in accordance with each drive mode.

Start Mode 1 (Initial Start Mode):

This mode is employed when the temperature of the engine ENG is low (coolant temperature Tc of the engine ENG below a predetermined value Ts), whereby the ignition key switch is turned on and the engine ENG is started in a cold condition.

As the ignition key switch is turned on, DC power is fed to the starter STR from the low-voltage battery BA2. The starter STR, in response to the supply of DC power, generates a rotating driving force that is transmitted to the crank shaft of the engine ENG, whereby the engine ENG is started.

As the engine ENG is started, the mixture gas inside the cylinders of the engine ENG is compressed by the rotation of the crank shaft and ignited by the ignition device. When the mixture gas is ignited and then completely combusted, the engine ENG produces a rotating driving force by itself.

It is also possible to use the motor generator M/G for starting the engine ENG in start mode 1. In this case, the operation of the motor generator M/G should be controlled by the inverter INV in accordance with an rpm instruction signal n* (rpm instruction value), which is outputted from the general control unit GCU, in the same way as in start mode 2 to be described below.

Start Mode 2 (Restart Mode):

This is a mode whereby, when the engine ENG is in a high temperature state and the ignition key switch is on, the operation of the engine ENG is terminated when the vehicle is stopping for a traffic light or the like, and then the engine ENG is restarted in a hot state when the vehicle moves, thereby resuming the operation of the engine ENG When the driver enters a signal for starting (such as a signal indicating the releasing of the brake pedal), the general control unit GCU outputs the rpm instruction signal n* (rpm instruction value) to the motor control unit MCU. In response, the inverter INV performs a DC-AC conversion operation as will be described below.

The motor control unit MCU calculates, based on the rpm instruction signal n* (rpm instruction value) outputted from the general control unit GCU, a control signal (control value) for operating the power semiconductor devices in the power module PMU. The calculated control signal (control value) is outputted to the drive circuit unit DCU, which then produces, based on the control signal (control value) from the motor control unit MCU, a drive signal for operating the power semiconductor devices in the power module PMU. The thus produced drive signal is outputted to the power module PMU, in which the power semiconductor devices are switched on and off in accordance with the drive signal from the drive circuit unit DCU so as to convert the DC power fed from the high-voltage battery BA1 into a three-phase AC power.

The three-phase AC power obtained by the conversion operation in the inverter INV is outputted to the stator STR of the motor generator M/G Thus, the motor generator M/G operates as an electric motor to produce a rotating driving force in accordance with the three-phase AC power outputted from the power module PMU.

The rotating driving force provided by the motor generator M/G is transmitted to the crank shaft of the engine ENG so that the engine ENG is restarted. The operation of the engine ENG after restart is the same as that in start mode 1.

Stop Mode 1 (Vehicle Stop Mode):

In stop mode 1, the operation of the engine ENG is stopped when the ignition key switch is off in order to stop the vehicle as a whole.

Stop Mode 2 (Idle Stop Mode):

In this mode, the operation (idling) of the engine ENG is stopped if, when the vehicle is stopping for a traffic light or the like, the ignition key switch is on, the accelerator pedal is not depressed, the vehicle speed is zero, and the charged amount VBc of the high-voltage battery BA1 exceeds a predetermined value VB1.

The general control unit GCU outputs an engine stop instruction signal to the engine control unit ECU when the above operating conditions are satisfied. As a result, the operation of each component unit of the engine ENG is stopped and the operation of the engine ENG is terminated.

Other conditions may be added to the drive conditions in stop mode 2, such as the temperature of coolant Tc of the engine ENG exceeding a predetermined value Ts, or the angle of inclination of the vehicle body θ dropping below a predetermined angle θs when the vehicle is not moving. If the drive conditions in stop mode 2 are not satisfied when the vehicle is not moving, the operation of the engine ENG may be allowed to continue in idle condition. If any of the accessories that use the engine ENG as the drive source, such as the air-conditioner compressor, for example, needs to be operated when the vehicle is in stop mode 2, the motor generator M/G may be operated as the drive source for such accessories so that they can be driven by the rotating driving force provided by the motor generator M/G.

Engine Run Mode:

In this mode, the vehicle is driven by the rotating driving force outputted by the engine ENG when a required torque τd is less than a target torque τa (i.e., the amount of depression of the accelerator pedal is small), or when the charge amount VBc of the high-voltage battery BA1 exceeds a predetermined value VBh. The predetermined value VBh is larger than the predetermined value VB1.

When the above drive conditions are satisfied, the general control unit GCU outputs a torque instruction signal (torque instruction value) to the motor control unit MCU and the engine control unit ECU. In this case, because the vehicle is driven by the engine ENG, the torque instruction signal (torque instruction value) that the general control unit GCU outputs to the motor control unit MCU is zero. Therefore, the rotating driving force provided by the motor generator M/G becomes zero.

The torque instruction signal (torque instruction value) that the general control unit GCU outputs to the engine control unit ECU has a value that corresponds to the engine rpm associated with the required torque τd. The engine control unit ECU calculates, based on the torque instruction signal (torque instruction value) from the general control unit GCU, a control signal (control value) for controlling the individual component units of the engine ENG. The calculated control signal (control value) is outputted to the drive unit for each of the component units of the engine ENG. Thus, the operation of each component unit of the engine ENG is controlled such that the air-fuel ratio of the gas mixture in the engine ENG, for example, can be controlled. As a result, the engine ENG outputs a rotating driving force corresponding to the required torque τd.

Engine Run/generate Mode:

In this mode, the motor generator M/G as well as the vehicle is driven by the rotating driving force outputted by the engine ENG such that the motor generator M/G is operated as a generator when: the required torque τd is smaller than the target torque τa (i.e., the amount of depression of the accelerator pedal is small) and the charge amount VBc of the high-voltage battery BA1 is less than the predetermined value VBh; or when the required torque τd is greater than the target torque τa (i.e., the amount of depression of the accelerator pedal is large) and the charge amount VBc of the high-voltage battery BA1 is less than the predetermined value VB1.

The general control unit GCU, when the above conditions are met, outputs a torque instruction signal (torque instruction value) to the motor control unit MCU and the engine control unit ECU.

The torque instruction signal (torque instruction value) outputted by the general control unit GCU to the motor control unit MCU is an instruction signal (instruction value) for causing the motor generator M/G to produce a predetermined rated power. It has a negative value opposite to that of the torque instruction signal (torque instruction value) for producing a rotating driving force. Thus, the inverter INV performs an AC-DC conversion operation as described below.

The motor control unit MCU calculates, based on the torque instruction signal (torque instruction value) outputted by the general control unit GCU, a control signal (control value) for operating the power semiconductor devices in the power module PMU. The calculated control signal (control value) is outputted to the drive circuit unit DCU, which produces, based on the control signal (control value) from the motor control unit MCU, a drive signal for operating the power semiconductor devices in the power module PMU. The thus produced drive signal is outputted to the power module PMU, in which the power semiconductor devices are switched on and off in accordance with the drive signal from the drive circuit unit DCU so as to convert the three-phase AC power fed from the motor generator M/G into a DC power.

The DC power obtained by the conversion in the inverter INV is outputted to the high-voltage battery BA1 (high-voltage power supply). Thus, the DC power fed to the high-voltage battery BA1 (high-voltage power supply) is consumed as driving force for high-voltage electric load while it charges the high-voltage battery BA1.

The torque instruction signal (torque instruction value) outputted from the general control unit GCU to the engine control unit ECU has a value of the sum of a value corresponding to the engine ENG rpm associated with the required torque τd and a value corresponding to a torque required for driving the motor generator M/G operating as a generator. The operation of the engine control unit ECU is similar to the operation in the foregoing engine ENG run mode and is therefore not described herein.

Acceleration Mode:

In this mode, the vehicle is driven by the rotating driving force outputted by the engine ENG and the motor generator M/G when the required torque τd exceeds the target torque τa and the charge amount VBc of the high-voltage battery BA1 exceeds a predetermined value VBL.

The general control unit GCU, when the above drive conditions are met, outputs a torque instruction signal (torque instruction value) to the motor control unit MCU and the engine control unit ECU.

The torque instruction signal (torque instruction value) includes a torque instruction signal (torque instruction value) corresponding to the required torque τde for the engine ENG and a torque instruction signal (torque instruction value) corresponding to the required torque τdm for the motor generator M/G The required torques τde and τdm are determined by distributing the required torque τd such that enhanced operating efficiency can be achieved for the engine ENG. The torque instruction signal (torque instruction value) corresponding to the required torque τde is outputted to the engine control unit ECU, while the torque instruction signal (torque instruction value) corresponding to the required torque τdm is outputted to the motor control unit MCU.

The operation of the inverter INV is similar to that of the DC-AC conversion described above and is therefore not described herein. The operation of the engine control unit ECU is similar to that of the engine run mode described above and is not described herein.

As described above, the engine ENG and the motor generator M/G output a rotating driving force commensurate with the required torque τd in a shared manner.

Regenerative Mode:

In this mode, the kinetic (rotating) energy of the wheels is transmitted to the motor generator M/G when the ignition key switch is on, the accelerator pedal is not depressed, the vehicle speed is greater than zero, and the charge amount VBc of the high-voltage battery BA1 is less than the predetermined value VBh, whereby the motor generator M/G is driven and operated as a generator.

If the above drive conditions are met, the general control unit GCU outputs a torque instruction signal (torque instruction value) to the motor control unit MCU and the engine control unit ECU. In this case, because the motor generator M/G is driven, the torque instruction signal (torque instruction value) outputted by the general control unit GCU to the engine control unit ECU is zero, so that the rotating driving force of the engine ENG is zero.

The torque instruction signal (torque instruction value) that the general control unit GCU outputs to the motor control unit MCU is an instruction signal (instruction value) for causing the motor generator M/G to produce a predetermined rated power, and it has a negative value opposite to that of the torque instruction signal (torque instruction value) for producing a rotating driving force. The operation of the inverter INV is similar to that of the DC-AC conversion operation described above and is therefore not described herein.

While the signal transmission and operation of the HEV has been described with reference to a particular embodiment, the location of the motor generator M/G may be between the engine ENG and the transmission T/M. In this case, the crank shaft of the engine ENG and the rotating shaft of the motor generator M/G are mechanically coupled either directly or via a clamping mechanism, such as a clutch. In such a configuration, which is suitable for an HEV in which a motor generator M/G as well as an engine ENG is used as the drive source for the vehicle, the voltage of the battery would be 200 V or higher. Operationally, the motor generator M/G would be used as the drive source in the low to middle speed ranges of the vehicle. In the high speed range of the vehicle, the engine ENG would be used as the drive source. In a high-load situation, such as when the vehicle is accelerating or climbing a hill, both the motor generator M/G and the engine ENG are used as the drive source.

The motor generator M/G and the inverter INV may be combined in a single unit. In this case, the inverter INV could be built inside the motor generator M/G on one axial end thereof (axial end opposite the pulley MPU). Alternatively, the inverter INV could be disposed above, below, or sideways of the periphery of the motor generator M/G and they could then be housed in an integrated casing. Which type of integration is to be used should be determined in view of the available mounting space or the like. However, from the space-saving perspective, the former is preferable.

Optionally, the low-voltage battery BA2 could be the sole power supply for the motor generator M/G In this case, another drive mode other than the above-described acceleration mode is provided.

Hereafter, the electric circuit configuration of the inverter INV according to the present embodiment will be described with reference to FIGS. 3 to 5.

The inverter INV of the embodiment is comprised of the power module PMU, drive circuit unit DCU, and motor control unit MCU.

Figure 4:
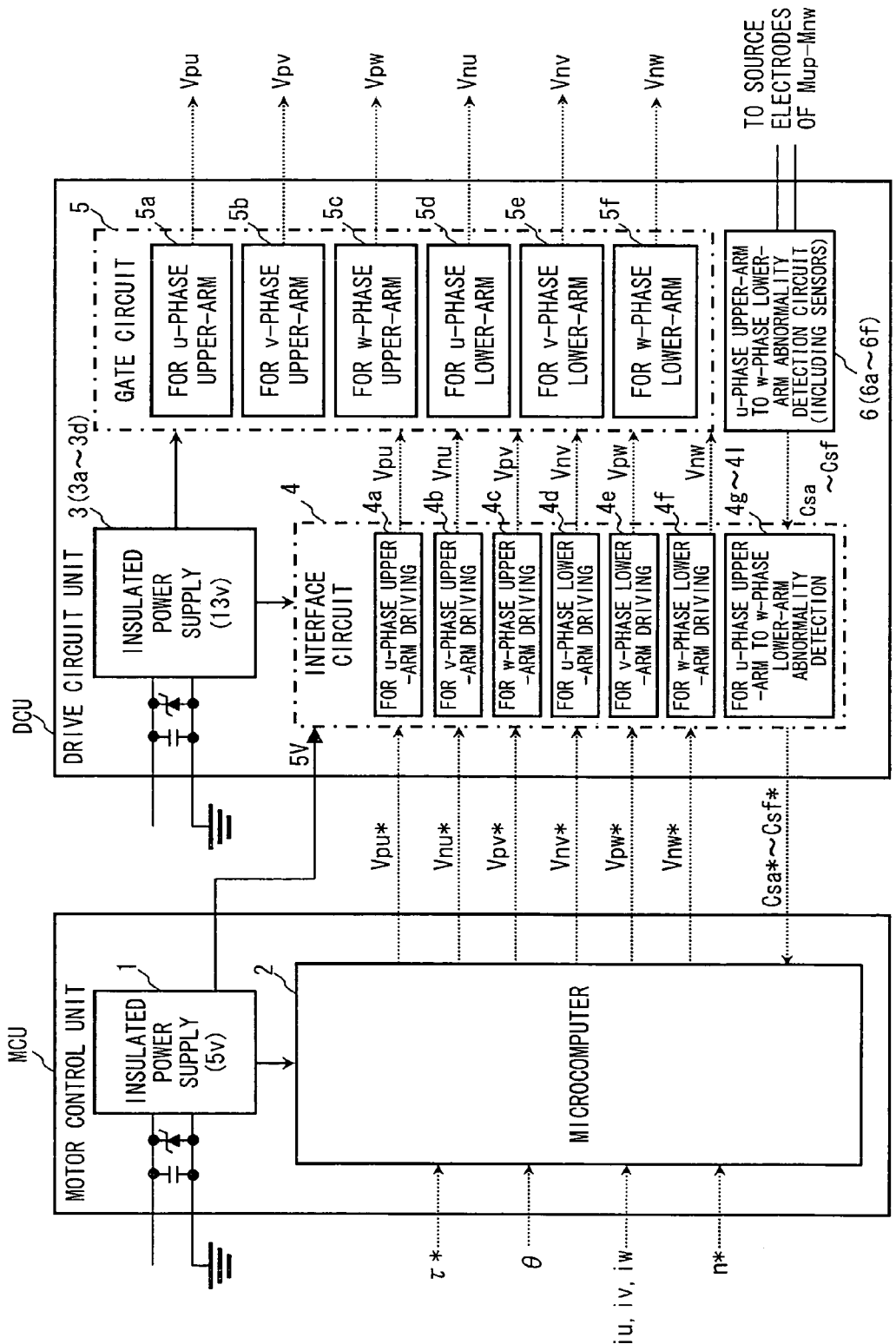
FIG. 4 shows a block diagram showing the circuit configuration of a motor control unit and a drive circuit unit in the inverter unit shown in FIG. 3, and the configuration of its signal system.
Figure 5:
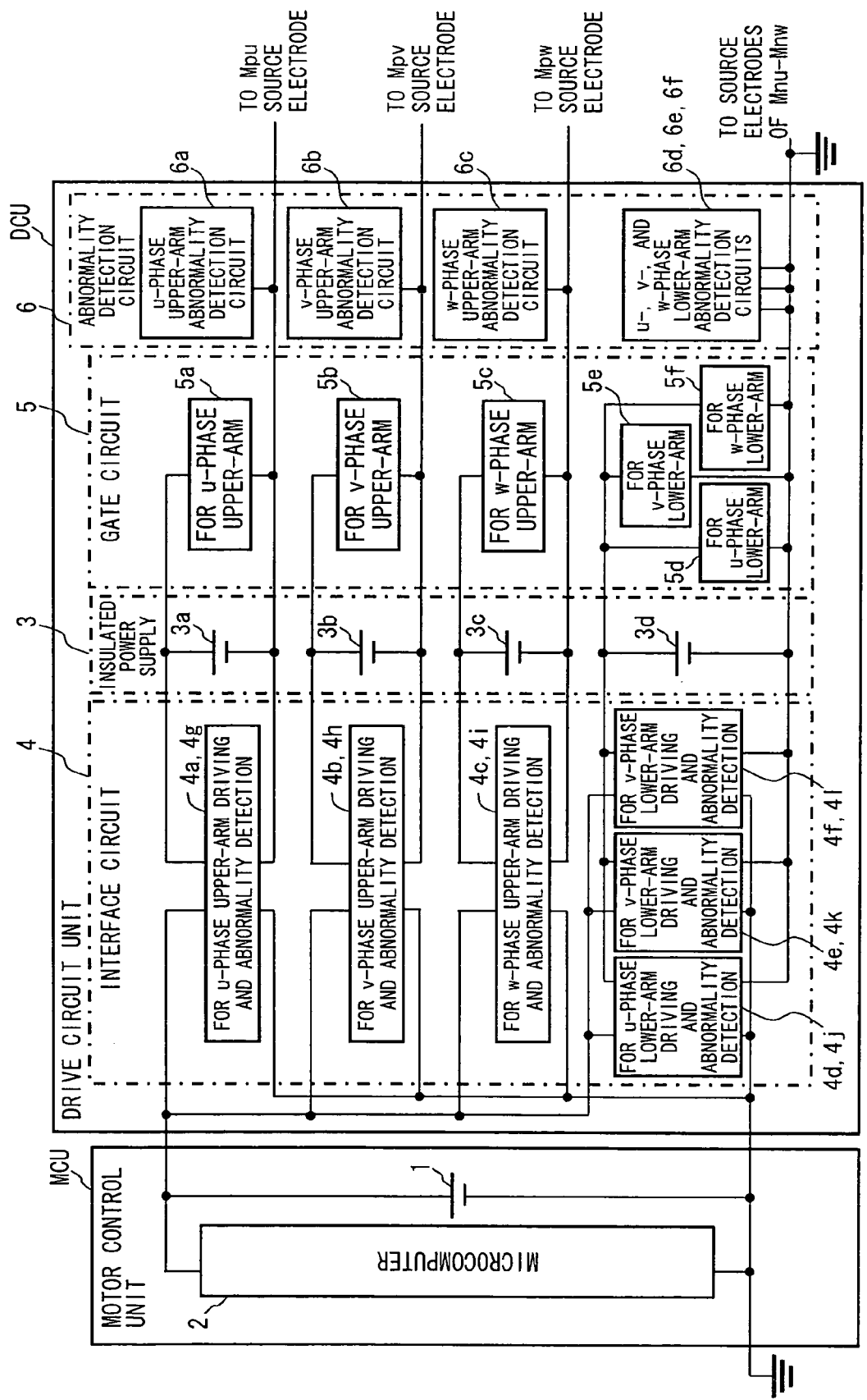
FIG. 5 shows a block diagram of power supply systems for the motor control unit and the drive circuit unit in the inverter unit shown in FIG. 3.
Figure 6:
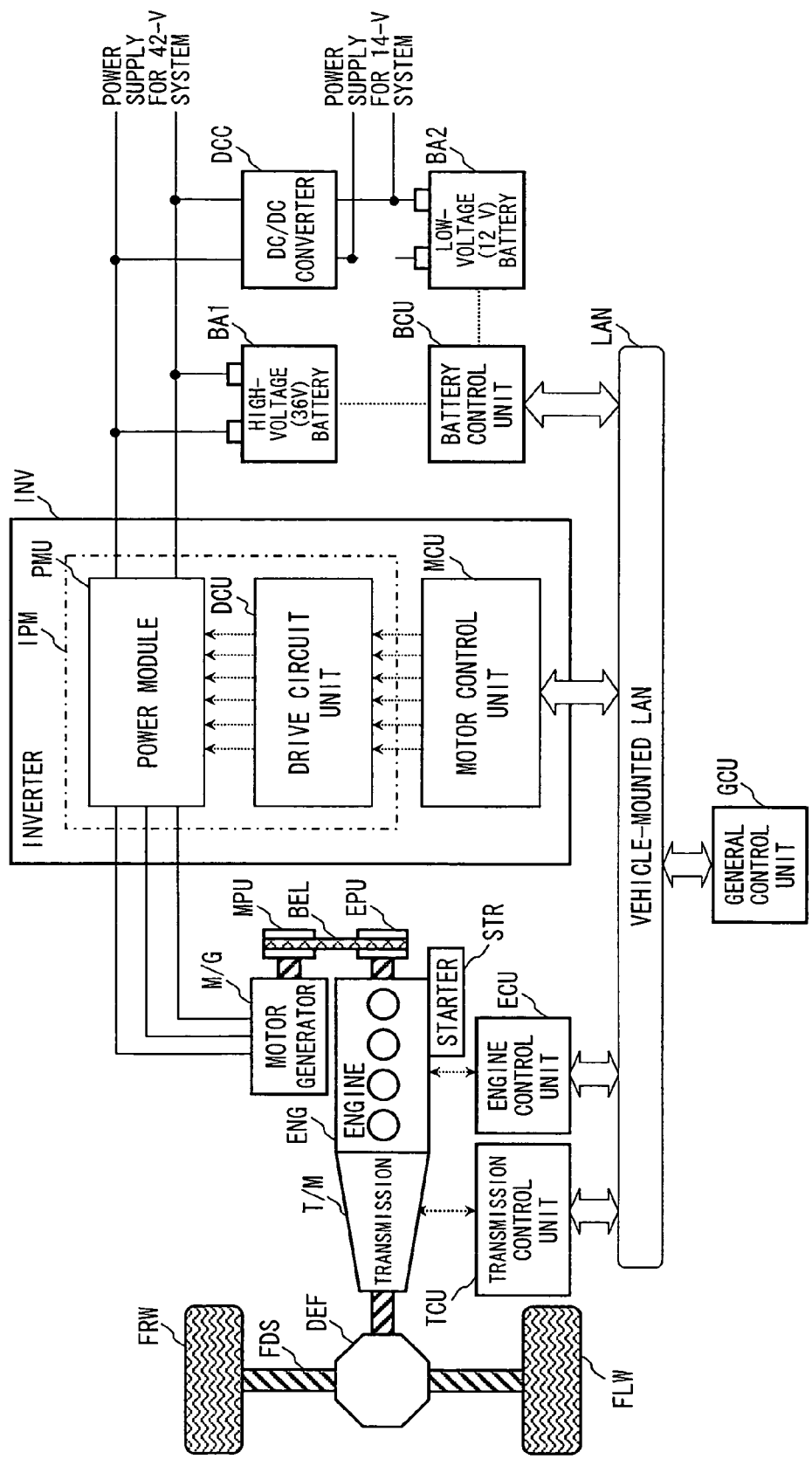
FIG. 6 shows a block diagram of a drive system of a hybrid vehicle in which the electrical machinery system shown in FIG. 3 is applied.

It is noted that in FIGS. 3 to 5, power-supply and power system lines are shown with solid lines while control-system lines are shown with broken lines and arrows for greater ease of identifying each of them.

FIG. 3 shows the circuit configuration of the power module PMU.

The power module PMU constitutes a main power conversion circuit. It operates in response to a drive signal outputted by the drive circuit unit DCU and converts the DC power fed to the high-voltage battery BA1 into a three-phase AC power, which is fed to the stator coils of the motor generator M/G The main circuit consists of a three-phase bridge circuit comprised of DC circuits for the three phases that are electrically connected in parallel between the positive pole and the negative pole of the high-voltage battery BA1. Each of the DC circuits, which are also referred to as arms, consists of two power semiconductor devices.

Each arm consists of a power semiconductor device on the upper arm side and a power semiconductor device on the lower arm side that are electrically connected in series to each other. In the present embodiment, the power semiconductor devices utilize n-channel MOSFETs (metal-oxide semiconductor field-effect transistors), which are switching semiconductor devices. The semiconductor chip of which the MOSFET is comprised has the three electrodes for drain, source, and gate. Between the drain electrode and the gate electrode, a parasitic diode is electrically connected, with the forward direction being from the source electrode to the drain electrode.

The power semiconductor device may employ an IGBT (insulated gate bipolar transistor). In this case, a diode element needs to be electrically connected between the collector electrode and the emitter electrode. An IGBT includes a gate electrode in addition to the collector electrode and the emitter electrode.

A u-phase arm Au is comprised of an electrical series connection of the source electrode of a power semiconductor device Mup and the drain electrode of a power semiconductor device Mun. A v-phase arm Av and a w-phase arm Aw are each likewise constructed, namely, they are comprised of an electrical series connection of the source electrode of power semiconductor devices Mvp or Mwp and the drain electrode of power semiconductor devices Mvn or Mwn.

The drain electrodes of the power semiconductor devices Mup, Mvp, and Mwp are electrically connected to the high-potential side (positive-pole side) of the high-voltage battery BA1. The source electrodes of the power semiconductor devices Mun, Mvn, and Mwn are electrically connected to a low-potential side (negative-pole side) of the high-voltage battery BA1. The middle point of the u-phase arm Au (where the source electrode of the power semiconductor device on the upper-arm side is connected to the drain electrode of the power semiconductor device on the lower-arm side) is electrically connected to the u-phase stator coil of the motor generator M/G The middle point of the v-phase arm Av and that of the w-phase arm Aw are also electrically connected to the v-phase and w-phase stator coils of the motor generator M/G, as is the middle point of the u-phase arm Au.

Between the positive-pole side and negative-pole side of the high-voltage battery BA1, a smoothing electrolytic capacitor SEC is electrically connected for controlling the fluctuation in the DC voltage produced by the operation of the power semiconductor devices.

Between the positive-pole side of the high-voltage battery BA1 and the input (DC) positive-pole side of the power module PMU, there is electrically connected an upper-arm main circuit inductance 100. Between the negative-pole side of the high-voltage battery BA1 and the input (DC) negative-pole side of the power module PMU, there is electrically connected a lower-arm main circuit inductance 200. The upper-arm main circuit inductance 100 and the lower-arm main circuit inductance 200 are parasitic inductances that exist in the wires between the high-voltage battery BA1 and the power module PMU, for example.

The power module PMU includes semiconductor chips mounted on a base via an insulating substrate, the base being enclosed by a casing. Electrical connection is provided between the semiconductor chips, between the semiconductor chips and input terminals, and between the semiconductor chips and output terminals via connecting conductors such as aluminum wires or planar conductors, so that a three-phase bridge circuit is formed. The base is made of a heat-conductive material, such as copper or aluminum, for example. The lower surface of the base is adapted to be cooled by a cooling medium, such as air or cooling water. In order to enhance the efficiency of cooling with the cooling medium, a fin or the like is provided on the lower surface of the base. The insulating substrate, which is made of an insulating material such as aluminum nitride, has wiring patterns metallized on both sides thereof. The semiconductor chips, of which the aforementioned MOSFETs are comprised, have electrodes on both sides thereof. The base and the insulating substrate, and the insulating substrate and the semiconductor chips, are connected with joining material such as solder.

FIG. 4 shows the circuit configuration of the drive circuit unit DCU and the motor control unit MCU, as well as the configuration of a signal system.

The drive circuit unit DCU is comprised of the so-called 6-in-1 integrated circuit (IC) in which a plurality of circuits associated with the upper- and lower-arms for each phase are integrated on a single circuit. The circuits associated with the upper- and lower-arms for each phase include an interface circuit 4, a gate circuit 5, and an abnormality detection circuit 6. The drive circuit unit DCU includes an insulated power supply 3 for driving the interface circuit 4 and the gate circuit 5.

The insulated power supply 3 is comprised of a transformer that provides an operating power supply. On the primary side (high-voltage side), there is connected the low-voltage battery BA2, while on the secondary side (lower-voltage side), circuits that require operating power supply are electrically connected. An operating voltage of 13 V is applied from the secondary side of the insulated power supply 3 to the interface circuit 4 and the gate circuit 5.

The interface circuit 4 constitutes a drive signal transmission circuit between the motor control unit MCU and the gate circuit 5, and an abnormality detection signal transmission circuit between the abnormality detection circuit 6 and the motor control unit MCU. Specifically, the interface circuit 4 consists of interface circuits for the upper and lower arms for each phase, namely: interface circuits 4a, 4b, and 4c for driving the upper arms for u-, v-, and w-phases; interface circuits 4d, 4e, and 4f for driving the lower arms for the u-, v-, and w-phases; interface circuits 4g, 4h, and 4i for detecting abnormality in the upper arms for u-, v-, and w-phases; and interface circuits 4j, 4k, and 4l for detecting abnormality in the lower arms for u-, v-, and w-phases.

The gate circuit 5 is a drive circuit that outputs a drive signal outputted by the interface circuits 4 to the power module PMU. It includes gate circuits 5a, 5b, and 5c for driving the upper arms for u-, v-, and w-phases, and gate circuits 5d, 5e, and 5f for driving the lower arms for u-, v-, and w-phases.

The power semiconductor device Mpu (Mpv, Mpw) is associated with the interface circuit 4a (4b, 4c) for driving the upper arm for u-phase (v-phase, w-phase), and the gate circuit 5a (5b, 5c) for driving the upper arm for u-phase (v-phase, w-phase). The output of the interface circuit 4a (4b, 4c) for driving the upper arm for u-phase (v-phase, w-phase) is electrically connected to the input of the gate circuit 5a (5b, 5c) for driving the upper arm for u-phase (v-phase, w-phase). The input to the interface circuit 4a (4b, 4c) is electrically connected to the motor control unit MCU. The output of the gate circuit 5a (5b, 5c) for driving the upper arm for u-phase (v-phase, w-phase) is electrically connected to the gate electrode of the power semiconductor device Mpu (Mpv, Mpw).

The interface circuit 4a (4b, 4c) for driving the upper arm for u-phase (v-phase, w-phase), upon receiving a control signal Vpu* (Vpv*, Vpw*) outputted from the motor control unit MCU, outputs drive signals Vpu (Vpv, Vpw) for driving the power semiconductor device Mpu (Mpv, Mpw) to the gate circuit 5a (5b, 5c) for driving the upper arm for u-phase (v-phase, w-phase). The drive signal Vpu (Vpv, Vpw) outputted from the interface circuit 4a (4b, 4c) for driving the upper arm for u-phase (v-phase, w-phase) is voltage-converted by the gate circuit 5a (5b, 5c) for driving the upper arm for u-phase (v-phase, w-phase). The voltage-converted drive signal, or Vpu (Vpv, Vpw) in the final stage, is outputted to the gate electrode of the power semiconductor device Mpu (Mpv, Mpw).

The power semiconductor device Mnu (Mnv, Mnw) is associated with the interface circuit 4d (4e, 4f) for driving the lower arm for u-phase (v-phase, w-phase) and the gate circuit 5d (5e, 5f) for driving the lower arm for u-phase (v-phase, w-phase). The output of the interface circuit 4d (4e, 4f) for driving the lower arm for u-phase (v-phase, w-phase) is electrically connected to the inputs to the gate circuit 5d (5e, 5f) for driving the lower arm for u-phase (v-phase, w-phase). The input to the interface circuit 4d (4e, 4f) is electrically connected to the motor control unit MCU. The output of the gate circuit 5d (5e, 5f) for driving the lower arm for u-phase (v-phase, w-phase) is electrically connected to the gate electrode of the power semiconductor device Mnu (Mnv, Mnw).

The interface circuit 4d (4e, 4f) for driving the lower arm for u-phase (v-phase, w-phase), in response to control signal Vnu* (Vnv*, Vnw*) outputted from the motor control unit MCU, outputs drive signal Vnu (Vnv, Vnw) for driving the power semiconductor devices Mnu (Mnv, Mnw) to the gate circuit 5d (5e, 5f) for driving the lower arm for u-phase (v-phase, w-phase). The drive signal Vnu (Vnv, Vnw) outputted from the interface circuit 4d (4e, 4f) for driving the lower arm for u-phase (v-phase, w-phase) is amplified by the gate circuit 5d (5e, 5f) for driving the lower arm for u-phase (v-phase, w-phase). The thus amplified drive signal, or Vnu (Vnv, Vnw) in the final stage, is outputted to the gate electrode of the power semiconductor device Mnu (Mnv, Mnw).

The abnormality detection circuit 6 detects an excess current that flows through the power semiconductor devices Mpu to Mnw. It includes abnormality detection circuits associated with each of the upper and lower arm for each phase, namely: upper arm abnormality detection circuits 6a, 6b, 6c for u-phase, v-phase, and w-phase; and lower arm abnormality detection circuits 6d, 6e, and 6f for u-phase, v-phase, and w-phase.

Each of the upper-arm abnormality detection circuits 6a, 6b, and 6c for u-phase, v-phase, and w-phase, and each of the lower-arm abnormality detection circuits 6d, 6e, and 6f for u-phase, v-phase, and w-phase are provided with a current sensor (not shown). The current sensors are comprised of current detection elements including a resistor element, for example, and are electrically connected to the source electrodes of the associated power semiconductor devices.

The upper-arm abnormality detection circuits 6a, 6b, and 6c for u-phase, v-phase, and w-phase and the lower-arm abnormality detection circuits 6d, 6e, and 6f for u-phase, v-phase, and w-phase receive voltage values (detection signals) detected by the associated current sensors. Thus, the upper-arm abnormality detection circuits 6a, 6b, and 6c for u-phase, v-phase, and w-phase and the lower-arm abnormality detection circuits 6d, 6e, and 6f for u-phase, v-phase, and w-phase each detect excess current in the associated power semiconductor device based on the detection signal outputted from the associated current sensor.

Upon detecting excess current in the associated power semiconductor device, the upper-arm abnormality detection circuits 6a, 6b, and 6c for u-phase, v-phase, and w-phase and the lower-arm abnormality detection circuits 6d, 6e, and 6f for u-phase, v-phase, and w-phase output associated abnormality detection signals Csa to Csf to the interface circuit 4. In response, the interface circuit 4 outputs fail-safe signals Csa* to Csf* to the motor control unit MCU via the associated upper-arm abnormality detection interface circuits 4g, 4h, and 4i for u-phase, v-phase, and w-phase and via the associated lower-arm abnormality detection interface circuits 4j, 4k, and 4l for u-phase, v-phase, and w-phase. Based on the fail-safe signals Csa* to Csf*, the motor control unit MCU performs excess current protection whereby the operation of one or more of the power semiconductor devices in which excess current has been detected are terminated.

Protection functions include excess voltage protection function and excess temperature protection function, in addition to the excess current protection function. The excess voltage protection function and the excess temperature protection function detects abnormality, employing sensors or the like, as does the excess current protection function. If abnormality is detected, an abnormality detection instruction signal is outputted to the motor control unit MCU via the interface circuit 4.

In the foregoing description of the present embodiment, the upper-arm abnormality detection interface circuits 4g, 4h, and 4i for u-phase, v-phase, and w-phase and the lower-arm abnormality detection interface circuits 4j, 4k, and 4l for u-phase, v-phase, and w-phase are shown in the drawing to constitute a single circuit. Similarly, the upper-arm abnormality detection circuits 6a, 6b, and 6c for u-phase, v-phase, and w-phase and the lower-arm abnormality detection circuits 6d, 6e, and 6f for u-phase, v-phase, and w-phase are shown in the drawing to constitute a single circuit. This is, however, for convenience's sake, and the abnormality detection interface circuits and the abnormality detection circuits are actually each comprised of six circuits so that they correspond one-to-one with the upper arms and lower arms for all phases each.

While in the present embodiment the abnormality detection signals Csa to Csf and the fail-safe signals Csa* to Csf* are each shown in the drawing by a single broken line, they are actually each consisted of six signals so that they correspond one-to-one with the upper and lower arms for each phase.

While in the present embodiment the input lines to the abnormality detection circuit 6 are shown in the drawing by a pair of solid lines, they actually consist of six pairs of input lines, i.e., 12 lines so that they correspond one-to-one with the upper-arm abnormality detection circuits 6a, 6b, and 6c for u-phase, v-phase, and w-phase and the lower-arm abnormality detection circuits 6d, 6e, and 6f for u-phase, v-phase, and w-phase.

The motor control unit MCU calculates control values for operating the power semiconductor devices in the power module PMU based on the plurality of input signals, and then outputs the calculated control values, namely control signals Vpu* to Vnw*, to the drive circuit unit DCU. For this purpose, the motor control unit MCU includes a microcomputer 2 for the calculation of control values and an insulated power supply 1 for driving the microcomputer 2.

The insulated power supply 1 is comprised of a transformer constituting an operating power supply, to the primary side (high-potential side) of which the low-voltage battery BA2 is electrically connected while to the secondary side (low-potential side) of which a power supply terminal of the microcomputer 2 is electrically connected. To the power supply terminal of the microcomputer 2 an operating voltage of 5 V that is outputted from the secondary side of the insulated power supply 1 is applied.

The microcomputer 2 receives input signals including a torque instruction signal (torque instruction value) τ*, an rpm instruction signal (rpm instruction value) n*, detection signals (current values for u-phase to w-phase) iu to iw, and a detection signal (the magnetic pole position of the rotor ROT) θ.

The torque instruction signal (torque instruction value) τ* and the rpm instruction signal (rpm instruction value) n* are outputted from the general control unit GCU depending on the drive mode of the vehicle. The detection signals (current values for u-phase to w-phase) iu to iw are outputted from the current sensors Cu to Cw. The detection signal θ (magnetic pole position of the rotor ROT) is outputted from a magnetic pole position sensor MPC.

The current sensors Cu to Cw detect currents iu to iw for u-phase to w-phase that are supplied from the inverter INV (power module PMU) to the stator coils of the stator STR of the motor generator M/G They are each comprised of a shunt resistor and a current transformer (CT), for example.

The magnetic pole position sensor MPC detects the magnetic pole position θ of the rotor ROT of the motor generator M/G and is comprised of a resolver, an encoder, a HALL element, and a HALL IC, for example.

The microcomputer 2 calculates current instruction values Id* and Iq* for a d-axis and a q-axis based on input signals and then calculates voltage control values Vu to Vw based on the thus calculated current instruction values Id* and Iq*. The microcomputer 2 then outputs the calculated voltage control values Vu to Vw to the drive circuit unit DCU in the form of control signals (PWM (pulse-width modulated signals) Vpu* to Vnw* for operating the power semiconductor devices in the power module PMU.

FIG. 5 shows the structure of a power supply system of the drive circuit unit DCU and the motor control unit MCU.

As mentioned above, the insulated power supply 1 is comprised of a single power supply with the output voltage of 5 V. The low-potential side (negative-pole side) of the insulated power supply 1 is electrically grounded, so that the reference potential of the insulated power supply 1 is ground potential.

The insulated power supply 3 is comprised of four power supplies with the output voltage of 13 V, namely: an insulated power supply 3a for the u-phase upper arm; an insulated power supply 3b for the v-phase upper arm; an insulated power supply 3c for the w-phase upper arm; and an insulated power supply 3d that is commonly provided for the lower arms for each phase.

The low-potential side (negative-pole side) of the u-phase (v-phase, w-phase) upper arm insulated power supply 3a (3b, 3c) is electrically connected to the source electrode of the power semiconductor device Mpu (Mpv, Mpw). Thus, the reference potential of the u-phase (v-phase, w-phase) upper arm insulated power supply 3a (3b, 3c) is the potential at the source electrode of the power semiconductor device Mpu (Mpv, Mpw). The low-potential side (negative-pole side) of the lower arm insulated power supply 3d is electrically connected to the source electrode of the power semiconductor devices Mnu to Mnw. The source electrode of the power semiconductor devices Mnu to Mnw is electrically grounded. Thus, the reference potential of the lower arm insulated power supply 3d is the potential at the source electrode of the power semiconductor devices Mnu to Mnw (ground potential).

The low-potential side (negative-pole side) of the insulated power supply 1 is electrically connected with the low-potential side (negative-pole side) power supply terminal of the microcomputer 2. The low-potential side (negative-pole side) of the insulated power supply 1 is electrically connected with one of the power supply terminals on the low-potential side (negative-pole side) of: the u-phase, v-phase, and w-phase upper-arm driving interface circuits 4a, 4b, and 4c; the u-phase, v-phase, and w-phase lower-arm driving interface circuits 4d, 4e, and 4f; the u-phase, v-phase, and w-phase upper-arm abnormality detection interface circuits 4g, 4h, and 4i; and the u-phase, v-phase, and w-phase lower-arm abnormality detection interface circuits 4j, 4k, and 4l.

The high-potential side (positive-pole side) of the insulated power supply 1 is electrically connected with the high-potential side (positive-pole side) power supply terminal of the microcomputer 2. The high-potential side (positive-pole side) of the insulated power supply 1 is electrically connected with one of the power supply terminals on the high-potential side (positive-pole side) of: the u-phase, v-phase, and w-phase upper-arm driving interface circuits 4a, 4b, and 4c; the u-phase, v-phase, and w-phase lower-arm driving interface circuits 4d, 4e, and 4f, the u-phase, v-phase, and w-phase upper-arm abnormality detection interface circuits 4g, 4h, and 4i; and the u-phase, v-phase, and w-phase lower-arm abnormality detection interface circuits 4j, 4k, and 4l.

Low-potential side (negative-pole side) of the u-phase (v-phase, w-phase) upper-arm insulated power supply 3a (3b, 3c) is electrically connected with the other side of the power supply terminals on the low-potential side (negative-pole side) of the u-phase (v-phase, w-phase) upper-arm driving interface circuit 4a (4b, 4c), and the u-phase (v-phase, w-phase) upper-arm abnormality detection interface circuit 4g (4h, 4i). The low-potential side (negative-pole side) of the u-phase (v-phase, w-phase) upper-arm insulated power supply 3a (3b, 3c) is electrically connected with, in addition to the aforementioned interface circuits, the low-potential side (negative-pole side) power supply terminal of the u-phase (v-phase, w-phase) upper-arm gate circuit 5a (5b, 5c) and with one terminal of the sensor in the u-phase (v-phase, w-phase) upper-arm abnormality detection circuit 6a (6b, 6c).

The high-potential side (positive-pole side) of the u-phase (v-phase, w-phase) upper-arm insulated power supply 3a (3b, 3c) is electrically connected with the high-potential side (positive-pole side) of the u-phase (v-phase, w-phase) upper-arm driving interface circuit 4a (4b, 4c) and the other side of the power supply terminals on the high-potential side (positive-pole side) of the u-phase (v-phase, w-phase) upper-arm abnormality detection interface circuit 4g (4h, 4i). The high-potential side (positive-pole side) of the u-phase (v-phase, w-phase) upper-arm insulated power supply 3a (3b, 3c) is electrically connected with, in addition to the aforementioned interface circuits, the high-potential side (positive-pole side) of the u-phase (v-phase, w-phase) upper-arm gate circuit 5a (5b, 5c).

The low-potential side (negative-pole side) of the lower-arm insulated power supply 3d is electrically connected with the other side of the low-potential side (negative-pole side) power supply terminal of the u-phase, v-phase, and w-phase lower-arm driving interface circuits 4d, 4e, and 4f and the u-phase, v-phase, and w-phase lower-aim abnormality detection interface circuits 4j, 4k, and 4l. The low-potential side (negative-pole side) of the lower-arm insulated power supply 3d is electrically connected with, in addition to the interface circuit, the low-potential side (negative-pole side) power supply terminal of the u-phase, v-phase, and w-phase lower-arm gate circuits 5d, 5e, 5f and with one side of the sensor in each of the u-phase, v-phase, and w-phase lower-arm abnormality detection circuits 6d, 6e, and 6f.

The high-potential side (positive-pole side) of the lower-arm insulated power supply 3d is electrically connected with the other side of the power supply terminals on the high-potential side (positive-pole side) of the u-phase, v-phase, and w-phase lower-arm driving interface circuits 4d, 4e, and 4f and the u-phase, v-phase, and w-phase lower-arm abnormality detection interface circuits 4j, 4k, and 4l. The high-potential side (positive-pole side) of the lower-arm power supply 3d is electrically connected with, in addition to the aforementioned interface circuit, the high-potential side (positive-pole side) of the u-phase, v-phase, and w-phase lower-arm gate circuits 5d, 5e, 5f.

Figure 2:
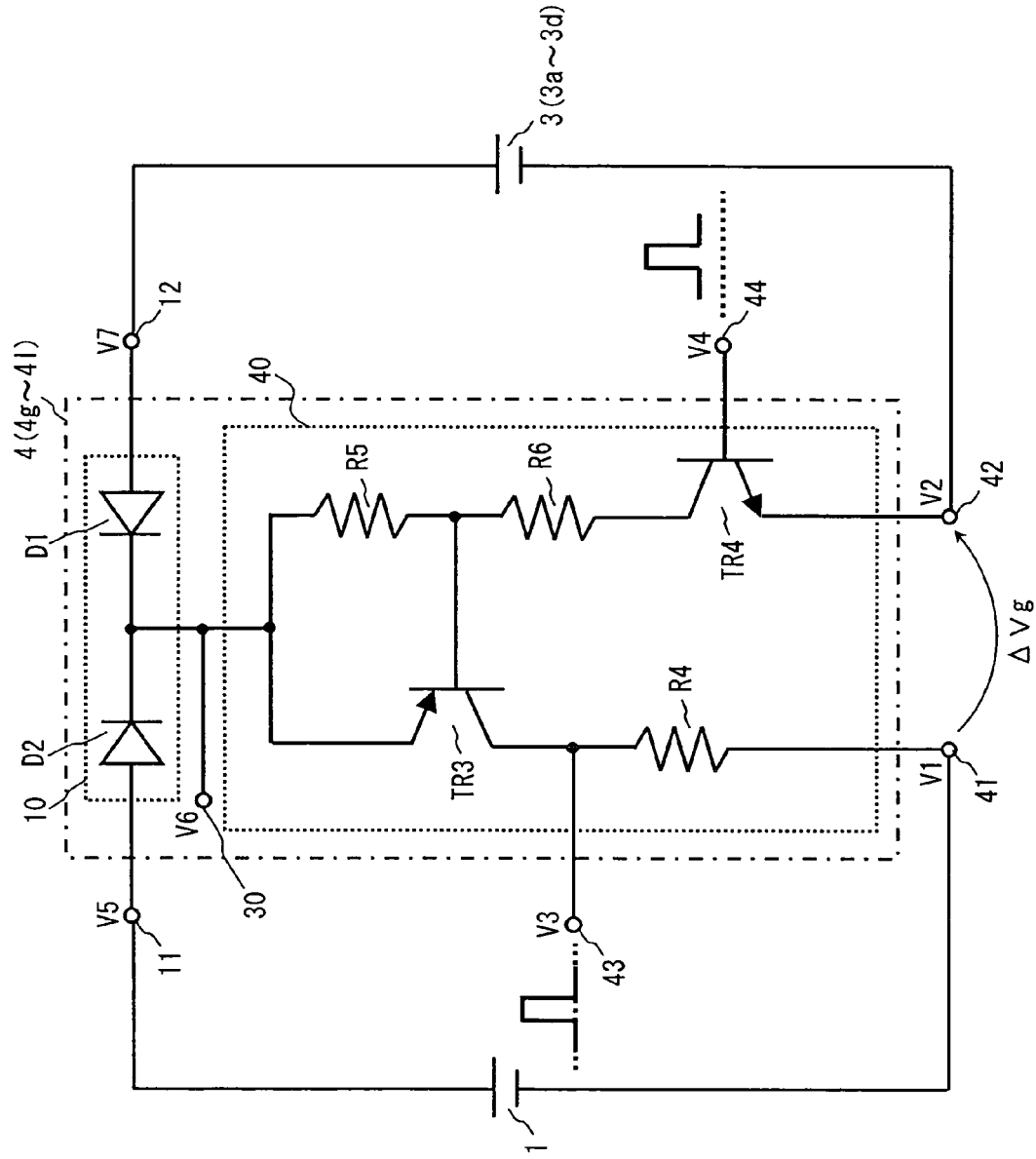
FIG. 2 shows a circuit diagram of an abnormality detection interface circuit according to the first embodiment of the invention.

With reference to FIGS. 1 and 2, the configuration of the interface circuit 4 in the present embodiment is described.

FIG. 1 shows the circuit configuration of the u-phase (v-phase, w-phase) upper-arm driving interface circuit 4a (4b, 4c) and the u-phase (v-phase, w-phase) lower-arm driving interface circuit 4d (4e, 4f), among the aforementioned interface circuits in the present embodiment.

The u-phase (v-phase, w-phase) upper-arm driving interface circuit 4a (4b, 4c) is a signal transmission circuit electrically connected between the microcomputer 2 and the u-phase (v-phase, w-phase) upper-arm gate circuit 5a (5b, 5c). It level-shifts the digital signal (voltage pulse signal) outputted from the microcomputer 2 into a digital signal (voltage pulse signal) adapted for the u-phase (v-phase, w-phase) upper-arm gate circuit 5a (5b, 5c) and then transmits the thus level-shifted signal thereto. The u-phase (v-phase, w-phase) upper-arm driving interface circuit 4a (4b, 4c) is electrically connected with the u-phase (v-phase, w-phase) upper-arm insulated power supply 3a (3b, 3c) and the insulated power supply 1 as operating power supplies.

The u-phase (v-phase, w-phase) lower-arm driving interface circuit 4d (4e, 4f) is a signal transmission circuit electrically connected between the microcomputer 2 and the u-phase (v-phase, w-phase) lower-arm gate circuit 5d (5e, 5f). It level-shifts the digital signal (voltage pulse signal) outputted from the microcomputer 2 into a digital signal (voltage pulse signal) adapted for the u-phase (v-phase, w-phase) lower-arm gate circuit 5d (5e, 5f) to which it is transmitted. The u-phase, v-phase, and w-phase lower-arm driving interface circuits 4d, 4e, and 4f are electrically connected with the lower-arm insulated power supply 3d and the insulated power supply 1 as operating power supplies.

As mentioned above, the power supply voltage of the insulated power supply 1 is 5 V. On the other hand, the power supply voltage of each of the u-phase, v-phase, and w-phase upper-arm insulated power supplies 3a, 3b, 3c and the lower-arm insulated power supply 3d is 13 V and larger than the power supply voltage of the insulated power supply 1. Thus, two different power supply voltages are used in the present embodiment. However, three or more different power supply voltages may be used in the operating power supplies for the interface circuits.

In the following, the circuit configuration of the u-phase, v-phase, and w-phase upper-arm driving interface circuits 4a, 4b, 4c and the u-phase, v-phase, and w-phase lower-arm driving interface circuits 4d, 4e, and 4f will be described in specific terms. Their individual circuit configurations, however, are all identical. Therefore, in the following description, the u-phase, v-phase, and w-phase upper-arm driving interface circuits 4a, 4b, 4c and the u-phase, v-phase, and w-phase lower-arm driving interface circuits 4d, 4e, and 4f will be collectively referred to as a driving interface circuit.

The driving interface circuit is comprised of a single semiconductor integrated circuit device (to be hereafter referred to as an "IC") in which a plurality of circuit elements are integrally mounted on a single silicon substrate. The IC includes a device main body (portion enclosed by an alternate long and short dashed line in FIG. 1), in which the entire integrated circuit is covered with a mold member (made of an electrically insulating resin), and a first to a fifth terminals 21 to 24 and 11 and a seventh terminal 12 that are led out of the mold member, with which the device main body is covered. In terms of circuit function, the driving interface circuit consists of a potential selection circuit 10 and a level shift circuit 20, which are electrically connected with each other via a sixth terminal 30.

The level shift circuit 20 is a signal transmission circuit for level-shifting the digital signal from the microcomputer 2 and transmitting the resultant signal to the gate circuits 5. The level shift circuit 20, which is comprised of two transistor elements and three resistor elements, receives a pulse signal (control signal with pulse voltage V3 outputted from the microcomputer 2) having a 1st potential V1 (potential at the low-potential side of the insulated power supply 1) as a reference potential. It then outputs a pulse signal (drive signal with pulse voltage V4, outputted to the gate circuits 5) having a 2nd potential V2 (potential at the low-potential side of the insulated power supply 3) as reference potential. The level shift circuit 20 is electrically connected with the first to fourth terminals 21 to 24 and the sixth terminal 30.

The first terminal 21 is electrically connected with the emitter electrode of an NPN transistor element TR1. The collector electrode of the NPN transistor element TR1 is electrically connected with one end of a current-limiting resistor element R2. The current-limiting resistor element R2 limits the current that flows into the collector electrode of the NPN transistor element TR1. The other end of the current-limiting resistor element R2 (end opposite to the end connected with the collector electrode of NPN transistor element TR1) is electrically connected with one end of a drive-voltage producing resistor element R1. The drive-voltage producing resistor element R1 produces a drive voltage for driving a PNP transistor element TR2 as will be described later. The other end of the drive-voltage producing resistor element R1 (end opposite to the end connected with the current-limiting resistor element R2) is electrically connected with the emitter electrode of the PNP transistor element TR2.

The collector electrode of the PNP transistor element TR2 is electrically connected with one end of an output signal producing resistor element R3, which produces an output signal at a fourth terminal 24 as will be described later. The other end of the output signal producing resistor element R3 (end opposite to the end connected to the collector electrode of the PNP transistor element TR2) is electrically connected with a second terminal 22. The base electrode of the NPN transistor element TR1 is electrically connected with a third terminal 23.

A fourth terminal 24 is electrically connected to the point of connection between the collector electrode of the PNP transistor element TR2 and the output signal producing resistor element R3. To the point of connection between the current-limiting resistor element R2 and the drive-voltage producing resistor element R1, there is electrically connected the base electrode of the PNP transistor element TR2. To the point of connection between the emitter electrode of the PNP transistor element TR2 and the drive-voltage producing resistor element R1, there is electrically connected a sixth terminal 30.

The first terminal 21 is electrically connected with the low-potential side of the insulated power supply 1. The second terminal 22 is electrically connected with the low-potential side of the insulated power supply 3. Thus, the 2nd potential V2 at the second terminal 22 is equal to the potential on the low-potential side of the insulated power supply 3. The 2nd potential V2 at the second terminal 22 becomes a floating potential with respect to 1st potential V1 for the u-phase, v-phase, and w-phase upper-arm driving interface circuits 4a, 4b, 4c. For the u-phase, v-phase, and w-phase lower-arm driving interface circuits 4d, 4e, and 4f, the 2nd potential V2 at the second terminal 22 becomes a reference potential equal to the 1st potential V1.

The 3rd terminal 23 is a control signal input terminal and is electrically connected with the microcomputer 2 having the same reference potential as the 1st potential V1. Thus, to the base electrode of the NPN transistor element TR1, there is inputted a signal outputted from the microcomputer 2, namely, a pulse signal (pulse voltage V3) having a reference potential that is equal to the 1st potential V1. The NPN transistor element TR1 is switched on and off by the pulse signal (pulse voltage V3).

The fourth terminal 24 is a control signal output terminal and is electrically connected with the gate circuits 5 having a reference potential that is equal to the 2nd potential V2. Thus, the level shift circuit 20 outputs a pulse signal (pulse voltage V4) having a reference potential equal to the 2nd potential V2 to the gate circuits 5, whose reference potential is equal to the 2nd potential V2.

The sixth terminal 30 is a high-potential side terminal of the operating power supply for the level shift circuit 20 and is electrically connected with a potential selection circuit 10. Thus, to the high-potential side terminal of the operating power supply of the level shift circuit 20, there is inputted (applied) a potential selected by the potential selection circuit 10.

The potential selection circuit 10 selects from a plurality of different potentials a potential for the high-potential side of the operating power supply voltage for the level shift circuit 20. It can therefore be considered an electric switching circuit. The potential selection circuit 10 is electrically connected with the fifth and seventh terminals 11 and 12 and the sixth terminal 30.

In one example, the potential selection circuit 10 is comprised of diode elements D1 and D2 whose cathodes are electrically connected with each other. The anode electrode of the diode element D1 is electrically connected with the seventh terminal 12. The anode electrode of the diode element D2 is electrically connected with the fifth terminal 11: The cathode electrodes of the diode elements D1 and D2 are electrically connected with the sixth terminal 30. The diode elements D1 and D2 have a forward direction running from the fifth terminal 11 and seventh terminal 12 to the sixth terminal 30.

The fifth terminal 11 is electrically connected with the high-potential side of the insulated power supply 1. Thus, to the anode electrode of the diode element D2, there is inputted (applied) the 5th potential V5 (potential at the high-potential side of the insulated power supply 1). The seventh terminal 12 is electrically connected with the high-potential side of the insulated power supply 3. Thus, to the anode electrode of the diode element D1, there is inputted (applied) the 7th potential V7 (potential at the high-potential side of the insulated power supply 3). The diode elements D1 and D2 select one of the inputted (applied) potentials, namely, 5th potential V5 and 7th potential V7, whose potential difference from the 1st potential V1 is greater, as a 6th potential V6. Thus, the potential selection circuit 10 inputs (applies) either the 5th potential V5 or the 7th potential V7 to the level shift circuit 20 as the 6th potential V6 on the high-potential side of the operating power supply voltage for the level shift circuit 20.

While in the present embodiment the 5th potential V5 and 7th potential V7 have been used as the input potentials to the potential selection circuit 10, three or more different potentials may be used as input potential to the potential selection circuit 10.

As an on-pulse (high-level) signal (control signal) having a reference potential equal to the potential on the low-potential side (1st potential) of the insulated power supply 1 is outputted from the microcomputer 2, the pulse signal is inputted (applied) to the base electrode of the NPN transistor element TR1 via the third terminal 23. As a result, the NPN transistor element TR1 is turned on. Assuming now that the potential difference of the 5th potential V5 with respect to the 1st potential V1 is V51, and the potential difference of the 7th potential V7 with respect to the 1st potential V1 is V71, the potential selection circuit 10 selects either potential difference V51 or V71 that has a greater potential difference and then inputs (applies) the selected potential difference to the level shift circuit 20 as an operating power supply voltage.

When TR1 is on, current flows through the drive-voltage producing resistor element R1 so that an operating voltage develops across the drive-voltage producing resistor element R1 for operating (turning on) the PNP transistor element TR2. The operating voltage is inputted (applied) to the base electrode of the PNP transistor element TR2. As a result, the PNP transistor element TR2 is turned on, whereby current flows through the output signal producing resistor element R3 so that an on-pulse signal is produced across the output signal producing resistor element R3, the signal having a reference potential equal to the potential on the low-potential side of the insulated power supply 3. The pulse signal is outputted to the gate circuits 5 with its reference potential level-shifted from the potential on the low-potential side of the insulated power supply 1 to the potential on the low-potential side of the insulated power supply 3.

The gate circuits 5 output a pulse signal to the gate electrode of the power semiconductor devices Mpu to Mnw in the power module PMU, using the pulse signal from the level shift circuit 20 as a final-stage drive signal. As a result, the power semiconductor devices Mpu to Mnw are turned on in accordance with the pulse signal outputted from the gate circuits 5.

As the pulse signal from the microcomputer 2 is turned off (low level), the NPN transistor element TR1 is turned off. As a result, current ceases to flow into the drive-voltage producing resistor element R1, whereby the voltage across the drive-voltage producing resistor element R1 (operating voltage for operating the PNP transistor element TR2) becomes zero and the PNP transistor element TR2 is turned off. As the PNP transistor element TR2 is turned off, the 4th potential V4 becomes equal to the 2nd potential V2 (low level), so that the pulse signal inputted to the gate electrode of the power semiconductor devices Mpu to Mnw is turned off. As a result, the power semiconductor devices Mpu to Mnw are turned off.

As described above, in accordance with the present embodiment, a pulse signal (having the potential on the low-potential side of the insulated power supply 1 as reference potential) outputted from the microcomputer 2 in the motor control unit MCU can be level-shifted into a pulse signal (having the potential on the low-potential side of the insulated power supply 3 as reference potential) that is transmitted to the gate circuits 5, without using an isolating means such as an optical isolator.

The level shift circuit is not limited to a bipolar transistor circuit but may be easily realized with a CMOS circuit or a BiCMOS circuit, for example.

In the following, the operation of the driving interface circuits is described on the assumption that the motor generator M/G is actually operated such that the upper-arm power semiconductor devices are turned on while the lower-arm power semiconductor devices are turned off.

When the present embodiment is applied to the upper-arm side, the 1st potential V1 would be on the low-potential side of the insulated power supply 1 while the 2nd potential V2 would be on the source potential of the upper-arm power semiconductor devices (namely, Mpu, Mpv, Mpw shown in FIG. 3). When these power semiconductor devices are turned on and off, the 2nd potential changes from zero to the battery voltage VB, when the potential difference $\Delta$VG between the 1st potential V1 and the 2nd potential V2 shown in FIG. 1 is VB−0=VB (positive voltage). When the output voltage of the insulated power supply 1 is 5 V and that of the insulated power supply 3 is 13 V, the potential difference V51 (5th potential difference with respect to the 1st potential V1) is 5V, while the potential difference V71 (7th potential difference with respect to the 1st potential) is 13 V+VB (positive voltage). Thus, the relationship between the potential difference V51 and the potential difference V71 is V51<V71. Therefore, the upper-arm driving interface circuits select the 7th potential (potential on the high-potential side of the insulated power supply 3) as the 6th potential V6 that is inputted (applied) to the level shift circuit 20.

The control signal (pulse signal) outputted from the microcomputer 2 has its reference potential level-shifted from the 1st potential V1 to the 2nd potential V2 and is then transmitted to the gate circuits 5 for the upper-arm side as a drive signal (pulse signal). Thus, to the gate electrode of the upper-arm power semiconductor devices, there is inputted (applied) the drive signal (pulse signal) outputted from the upper-arm gate circuits 5. As a result, the upper-arm power semiconductor devices are turned on and off in accordance with the drive signal (pulse signal) outputted from the upper-arm gate circuits 5.

On the other hand, when the present embodiment is applied to the lower-arm side, the 1st potential V1 is on the low-potential side of the insulated power supply 1 while the 2nd potential V2 is equal to the source potential of the lower-arm power semiconductor devices (namely, Mnu, Mnv, Mnw shown in FIG. 3). On the lower-arm side, a transient current flows through the lower-arm main circuit inductance 200 due to the switching of the power semiconductor devices, thereby producing a voltage noise. Assuming that the inductance value LS2 of the lower-arm main circuit inductance 200 were 10 nH and the transient current dI/dt that flows through the lower-arm main circuit inductance 200 during switching were on the order of 500 A/μs, the voltage noise would be ±5 volts. In an experiment conducted by the inventors, a voltage noise of approximately ±5 volts has been observed when the motor output current was several hundred amperes rms. The voltage noise is dependent on the inductance value LS2 of the lower-arm main circuit inductance 200 and the transient current dI/dt that flows through the lower-arm main circuit inductance 200 during switching. When the value of voltage noise is ±VL volts, a potential difference $\Delta$VG between the 1st potential V1 and the 2nd potential V2 varies within ±VL volts.

When the output voltage of the insulated power supply 1 is 5 V and the output voltage of the insulated power supply 3 is 13 V, and when a voltage noise of ±VL is produced such that the potential difference $\Delta$VG satisfies the condition $\Delta$VG>−8, the relationship between the potential difference V51 (5th potential difference with respect to 1st potential V1) and the potential difference V71 (7th potential difference with respect to 1st potential V1) would be such that V51<V71. Thus, the lower-arm driving interface circuits select the 7th potential V7 (potential at the high-potential side of the insulated power supply 3) as the 6th potential V6 and input (apply) it to the level shift circuit 20. In this case, the 6th potential V6 inputted (applied) to the level shift circuit 20 would be such that V6=V7=$\Delta$VG+13−Vd. Vd is the on-voltage (approximately 0.7V) of the diodes D1 and D2 shown in FIG. 1.

If a voltage noise ±VL is generated such that the potential difference $\Delta$VG satisfies the condition $\Delta$VG<−8, the relationship between the potential difference V51 and the potential difference V71 would be such that V51>V71. Thus, the lower-arm driving interface circuits select the 1st potential V1 (potential on the high-potential side of the insulated power supply 1) as the 6th potential V6 and input (apply) it to the level shift circuit 20. In this case, the 6th potential V6 inputted (applied) to the level shift circuit 20 would be such that V6=V5=5−Vd from the relationship of number 6. Vd is the on-voltage (approximately 0.7V) of the diodes D1 and D2 shown in FIG. 1.

If a voltage noise ±VL is generated such that the potential difference $\Delta$VG satisfies the condition $\Delta$VG=−8, the relationship between the potential difference V51 and the potential difference V71 would be such that V51=V71. Thus, in the lower-arm driving interface circuits, the 6th potential V6 selected by the potential selection circuit 10 would be such that V6=V5=V7=5−Vd. Vd is the on-voltage (approximately 0.7V) of the diodes D1 and D2 shown in FIG. 1.

In this way, the lower-arm driving interface circuits can normally operate the level shift circuit 20 even when there is fluctuation in the potential difference $\Delta$VG.

The control signal (power supply) outputted from the microcomputer 2 has its reference potential level-shifted from the 1st potential V1 to the 2nd potential V2 and then is transmitted to the lower-arm gate circuits 5 as a drive signal (pulse signal). Thus, to the gate electrode of the lower-arm power semiconductor devices, there is inputted (applied) the drive signal (pulse signal) outputted by the lower-arm gate circuits. As a result, the lower-arm power semiconductor devices are turned on and off in accordance with the drive signal (pulse signal) from the lower-arm gate circuits 5.

Thus, in accordance with the present embodiment, the driving interface circuits can be normally operated without being influenced by the steady or transient fluctuation in the potential of the source electrode of the power semiconductor devices Mpu to Mnw as the motor generator M/G is driven. Specifically, because the 6th potential V6 for the level shift circuit 20 is selected by the potential selection circuit 10, the level shift circuit 20 can be normally operated even when there is fluctuation in the 2nd potential V2 due to noise or the like, and the power semiconductor devices Mpu to Mnw can be normally operated. As a result, the noise tolerance and reliability of the driving interface circuits can be enhanced.

Thus, in accordance with the present embodiment, the interface circuit 4 can be provided that enables signal transmission between the motor control unit MCU and the drive circuit unit DCU without employing an optical isolator and which has superior noise tolerance, reliability and heat-tolerance.

Furthermore, in accordance with the present embodiment, because the driving interface circuit can be constructed of circuit elements such as bipolar transistors, metal-oxide semiconductor field-effect transistors, diodes, and resistors, the driving interface circuit can be fabricated as an IC. Thus, in accordance with the present embodiment, the driving interface circuits can be mounted on the same substrate together with other driving-circuit components, so that the interface circuit 4 can be reduced in size. As a result, in accordance with the present embodiment, the inverter device INV can be reduced in size.

For the fabrication of the driving interface circuit in the form of an IC, the gate circuits 5 may also be included. The fabrication of the driving interface circuits as an IC may also be implemented on a phase-by-phase and arm-by-arm basis (1-in-1), or on a phase-by-phase basis (2-in-1). Alternatively, it may be implemented on an arm-by-arm basis (3-in-1) or for all of the driving interface circuits together (6-in-1).

When the potential selection circuit 10 is configured using the diode elements D1 and D2 as in the present embodiment, a sink current flows into the seventh terminal 12 if the relationship between the potential difference V51 and the potential difference V71 is such that V51<V71. If the relationship between the potential difference V51 and the potential difference V71 is such that V51>V71, a sink current flows to the fifth terminal 11. If the relationship between the potential difference V51 and the potential difference V71 is such that V51=V71, sink currents of the same current amount flow into the fifth terminal 11 and the seventh terminal 12. Therefore, by determining the relationship between the potential difference V51 and the potential difference V71 in magnitude and measuring the current that flows into the fifth terminal 11 and the seventh terminal 12, the presence or absence of use of the interface circuit according to the invention can be confirmed.

FIG. 2 shows the circuit configuration of the u-phase, v-phase, and w-phase upper-arm abnormality detection interface circuits 4g, 4h, and 4i and the u-phase, v-phase, and w-phase lower-arm abnormality detection interface circuits 4j, 4k, and 4l, among the interface circuits of the invention.

The u-phase, v-phase, and w-phase upper-arm abnormality detection interface circuits 4g, 4h, and 4i and the u-phase, v-phase, and w-phase lower-arm abnormality detection interface circuits 4j, 4k, and 4l have an identical circuit configuration. Thus, in the following description, the u-phase, v-phase, and w-phase upper-arm abnormality detection interface circuits 4g, 4h, and 4i and the u-phase, v-phase, and w-phase lower-arm abnormality detection interface circuits 4j, 4k, and 4l will be collectively referred to as an abnormality detection interface circuit.

The abnormality detection interface circuit is comprised of a potential selection circuit 10 and a level shift circuit 40, as is the driving interface circuit. Because the configuration and operation of the potential selection circuit 10 in the abnormality detection interface circuit are the same as those of the potential selection circuit in the driving interface circuit, the individual constituent elements are referenced by the same numerals and redundant explanation is omitted. With regard to the level shift circuit 40, the circuit from the sixth terminal 30 to the first terminal 21 of the driving interface circuit shown in FIG. 1 (left-side of the circuit shown in FIG. 1) is exchanged with the circuit from the sixth terminal 30 to the second terminal 22 (right-side of the circuit shown in FIG. 1).

Thus, in the level shift circuit 40, a fourth terminal 44 is electrically connected with the base electrode of the NPN transistor element TR4, whose emitter electrode is electrically connected with a second terminal 42. Between the collector electrode of a PNP transistor element TR3 and an output signal producing resistor element R4, there is electrically connected a third terminal 43. The end of the output signal producing resistor element R4 opposite to the end thereof connected with the collector electrode of the PNP transistor element TR3 is electrically connected with a first terminal 41. In FIG. 2, R5 and R6 designate a drive-voltage producing resistor element and a current-limiting resistor element, respectively.

When a pulse signal indicating the detection of abnormality (high-level abnormality detection signal) having a reference potential equal to the potential on the low-potential side of the insulated power supply 3 (potential at the source electrode of the power semiconductor devices) is outputted from the abnormality detection circuit 6, the pulse signal is inputted (applied) to the base electrode of the NPN transistor element TR4 via the fourth terminal 44. As a result, the NPN transistor element TR4 is turned on. When the potential difference between the 1st potential V1 and the 5th potential V5 is V51 and the potential difference between the 1st potential V1 and the 7th potential V7 is V71, the potential selection circuit 10 selects either V51 or V71 whose potential difference is greater and inputs (applies) it to the level shift circuit 40 as an operating power supply voltage.

When TR4 is on, current flows through the drive-voltage producing resistor element R5 whereby an operating voltage develops across the drive-voltage producing resistor element R5 for operating (turning on) the PNP transistor element TR3. The operating voltage is inputted (applied) to the base electrode of the PNP transistor element TR3. As a result, the PNP transistor element TR3 is turned on, whereby current flows through the output signal producing resistor element R4 and a pulse signal (fail-safe signal) having a reference potential equal to the potential on the low-potential side of the insulated power supply 1 is produced across the output signal producing resistor element R4, indicating the detection of abnormality. The pulse signal (fail-safe signal) is outputted to the microcomputer 25, with its potential on the low-potential side of the insulated power supply 3 level-shifted to the potential on the low-potential side of the insulated power supply 1.

The microcomputer 2 effects an interlock based on the pulse signal (fail-safe signal) from the level shift circuit 40 so as to turn off the operation of any or all of the power semiconductor devices Mpu to Mnw in which abnormality has been detected. In this way, the power semiconductor devices Mpu to Mnw are protected from excess current.

When the excess current ceases and the pulse signal (abnormality detection signal) from the abnormality detection circuit 6 indicates the absence of detection of abnormality (low-level), the NPN transistor element TR4 is turned off. Consequently, current ceases to flow through the drive-voltage producing resistor element R5 and the voltage across the drive-voltage producing resistor element R5 becomes zero, so that the PNP transistor element TR3 is turned off. As the PNP transistor element TR3 is turned off, a 3rd potential V3 becomes equal to the 1st potential V1 (low-level), so that the pulse signal (fail-safe signal) inputted to the microcomputer 2 indicates no detection of abnormality (low-level). Therefore, the microcomputer 2 releases the interlock.

The level shift circuit is not limited to a bipolar transistor circuit and may also be easily realized with a CMOS circuit or a BiCMOS circuit, for example.

The operation of the abnormality detection interface circuit is similar to that of the driving interface circuit when the motor generator M/G is actually operated and the upper-arm power semiconductor devices are turned on while the lower-arm power semiconductor devices are turned off.

When the present embodiment is applied to the upper-arm side, the 1st potential V1 is equal to the potential on the low-potential side of the insulated power supply 1 while the 2nd potential V2 is equal to the source potential of the upper-arm power semiconductor devices (Mpu, Mpv, Mpw shown in FIG. 3). When these power semiconductor devices are turned on and off, the 2nd potential varies from zero to the battery voltage VB. In this case, the potential difference ΔVG between the 1st potential V1 and the 2nd potential V2 shown in FIG. 2 is such that ΔVG=VB−0=VB (positive voltage). When the output voltage of the insulated power supply 1 is 5 V and that of the insulated power supply 3 is 13 V, potential difference V51 (5th potential difference with respect to 1st potential V1) is 5 V and the potential difference V71 (7th potential difference with respect to 1st potential) is 13 V+VB (positive voltage). Thus, the relationship between the potential difference V51 and the potential difference V71 is such that V51<V71. Thus, the upper-arm driving interface circuits select the 7th potential (potential on the high-potential side of the insulated power supply 3) as the 6th potential V6 and input (apply) it to the level shift circuit 20.

The abnormality detection signal outputted from the abnormality detection circuit 6 is transmitted to the microcomputer 2 as a fail-safe signal with its reference potential level-shifted from the 2nd potential V2 to the 1st potential V1.

When the present embodiment is applied to the lower-arm side, the 1st potential V1 is equal to the potential on the low-potential side of the insulated power supply 1 while the 2nd potential V2 is equal to the source potential of the lower-arm power semiconductor devices (Mnu, Mnv, and Mnw shown in FIG. 3). On the lower-arm side, transient current flows through the lower-arm main circuit inductance 200 shown in FIG. 3 due to the switching of the power semiconductor devices, thereby producing a voltage noise. When, for example, the inductance value LS2 of the lower-arm main circuit inductance 200 is 10 nH, and the transient current dI/dt that flows through the lower-arm main circuit inductance 200 during switching is approximately 500 A/μs, a voltage noise of ±5 volts would be generated. In an experiment conducted by the inventors, a voltage noise of approximately ±5 volts has been observed when the motor output current was several hundred amperes rms. The voltage noise is dependent on the inductance value LS2 of the lower-arm main circuit inductance 200 and the transient current dI/dt that flows through the lower-arm main circuit inductance 200 during switching. When the value of voltage noise is ±VL volts, a potential difference ΔVG between the 1st potential V1 and the 2nd potential V2 varies within ±VL volts.

When the output voltage of the insulated power supply 1 is 5 V and the output voltage of the insulated power supply 3 is 13 V, and when a voltage noise of ±VL is produced such that the potential difference ΔVG satisfies the condition ΔVG>−8, the relationship between the potential difference V51 (5th potential difference with respect to 1st potential V1) and the potential difference V71 (7th potential difference with respect to 1st potential V1) would be such that V51<V71. Thus, the lower-arm abnormality detecting interface circuits select the 7th potential V7 (potential at the high-potential side of the insulated power supply 3) as the 6th potential V6 and input (apply) it to the level shift circuit 40. In this case, the 6th potential V6 inputted (applied) to the level shift circuit 40 would be such that V6=V7=ΔVG+13−Vd. Vd is the on-voltage (approximately 0.7V) of the diodes D1 and D2 shown in FIG. 2.

If a voltage noise ±VL is generated such that the potential difference ΔVG satisfies the condition ΔVG<−8, the relationship between the potential difference V51 and the potential difference V71 would be such that V51>V71. Thus, the lower-arm abnormality detecting interface circuits select the 1st potential V1 (potential on the high-potential side of the insulated power supply 1) as the 6th potential V6 and input (apply) it to the level shift circuit 20. In this case, the 6th potential V6 inputted (applied) to the level shift circuit 20 would be such that V6=V5=5−Vd from the relationship of number 6. Vd is the on-voltage (approximately 0.7V) of the diodes D1 and D2 shown in FIG. 2.

If a voltage noise ±VL is generated such that the potential difference ΔVG satisfies the condition ΔVG=−8, the relationship between the potential difference V51 and the potential difference V71 would be such that V51=V71. Thus, in the lower-arm abnormality detecting interface circuits, the 6th potential V6 selected by the potential selection circuit 10 would be such that V6=V5=V7=5−Vd. Vd is the on-voltage (approximately 0.7V) of the diodes D1 and D2 shown in FIG. 2.

In this way, the lower-arm abnormality detecting interface circuits can normally operate the level shift circuit 40 even when there is fluctuation in the potential difference ΔVG.

As the level shift circuit 40 is normally operated, the microcomputer 2 can accurately effect and release the interlock based on the pulse signal (fail-safe signal) from the level shift circuit 40.

Thus, in accordance with the present embodiment, the abnormality detection interface circuits can be configured and operated in the same way as the driving interface circuits, so that they can provide operational effects similar to those of the driving interface circuits.

Embodiment 2

A second embodiment of the invention will be described with reference to FIG. 7.

Figure 7:
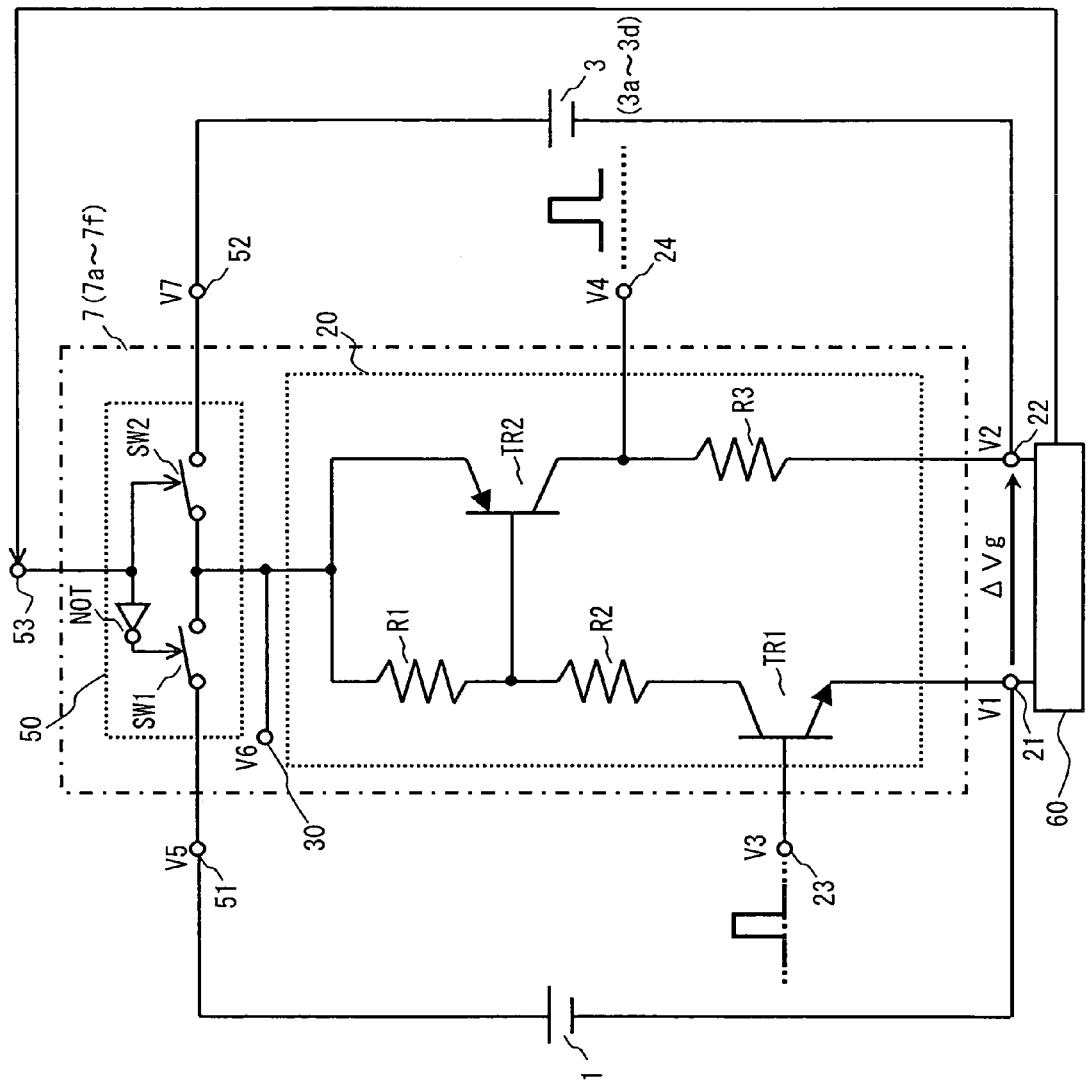
FIG. 7 shows a circuit diagram of a driving interface circuit according to a second embodiment of the invention.

FIG. 7 shows the circuit configuration of driving interface circuits 7 (u-phase, v-phase, and w-phase upper-arm driving interface circuits 7a, 7b, and 7c and u-phase, v-phase, and w-phase lower-arm driving interface circuits 7d, 7e, and 7f).

The present embodiment is a variation of the first embodiment and differs therefrom in the configuration of the potential selection circuit. Other portions are identical to those of the first embodiment.

While the following description of the present embodiment is made with reference to the driving interface circuits 7, it is possible to configure an abnormality detection interface circuit by exchanging the circuit from the sixth terminal 30 to the first terminal 21 of the level shift circuit 20 (left-side of the circuit shown in FIG. 7) for the circuit from the sixth terminal 30 to the second terminal 22 thereof (right-side of the circuit shown in FIG. 7), as is the case with the first embodiment.

The potential selection circuit 50 selects either the 5th potential V5 or the 7th potential V7 as the potential (6th potential V6) on the high-potential side of the operating power supply voltage for the level shift circuit 20, depending on the potential difference between the 1st potential V1 and the 2nd potential V2. The potential selection circuit 50 is comprised of an electric switching circuit consisting of switches SW1 and SW2 electrically connected in series. The switches SW1 and SW2, which include transistors, are semiconductor switches that operate in accordance with an instruction signal inputted via an input terminal 53.

One end of the switch SW1 (opposite to the end thereof connected to the switch SW2) is electrically connected with a fifth terminal 51. One end of the switch SW2 (opposite to the end thereof connected to the switch SW1) is electrically connected with a seventh terminal 52. The connection point between the switch SW1 and the switch SW2 is electrically connected with the sixth terminal 30. To the switch SW2, there is directly inputted an instruction signal inputted via an input terminal 53. To the switch SW1, an instruction signal inputted via the input terminal 53 is inputted via an inverter NOT. In the present embodiment, the potential selection circuit 50 is comprised of a selector circuit including an analog switch.

The input terminal 53 is electrically connected with a comparator 60. The comparator 60 is a control circuit that compares the 1st potential V1 and the 2nd potential V2 inputted via the first terminal 21 and the second terminal 22 and then outputs an instruction signal to the potential selection circuit 50. The comparator 60 determines a difference voltage $\Delta VG$ between the 1st potential V1 and the 2nd potential V2 and then outputs a high- or on-signal when the difference voltage $\Delta VG$ satisfies the condition $\Delta VG \geqq 0$. When the difference voltage $\Delta VG$ satisfies the condition $\Delta VG < 0$, the comparator 60 outputs a low- or off-signal.

When the instruction signal outputted from the comparator 60 is a high- or on-signal, the high- or on-signal is directly inputted to the switch SW2. To the switch SW1, the high- or on-signal inverted by the inverter NOT, namely, a low- or off signal, is inputted. As a result, the switch SW1 is turned off while the switch SW2 is turned on. Thus, the potential selection circuit 50 selects the 7th potential V7 and inputs (applies) it to the level shift circuit 20 as the operating voltage (which is the potential on the high-potential side, namely, 6th potential V6). In this case, the potential difference V71 is greater than the potential difference V51.

When the instruction signal outputted from the comparator 60 is a low- or off signal, the low- or off signal is directly inputted to the switch SW2. To the switch SW1, the low- or off signal inverted by the inverter NOT, namely, a high- or on-signal, is inputted. As a result, the switch SW1 is turned on while the switch SW2 is turned off. Thus, the potential selection circuit 50 selects the 5th potential V5 and inputs (applies) it to the level shift circuit 20 as its operating voltage (which is the potential on the high-potential side, namely, 6th potential V6). In this case, the potential difference V51 is greater than the potential difference V71.

Thus, in the present embodiment, the potential selection circuit 60 is operated in accordance with an instruction signal (external signal) that is based on the fluctuation in potential difference between the 1st potential V1 and the 2nd potential V2. Accordingly, the level shift circuit 20 can be operated even when there is fluctuation in the potential difference $\Delta VG$, as in the first embodiment.

In accordance with the present embodiment, as in the first embodiment, an interface circuit can be provided that enables signal transmission between the motor control unit MCU and the drive circuit unit DCU without employing an optical isolator and which has superior noise tolerance, reliability and heat-tolerance.

Furthermore, in accordance with the present embodiment, the potential selection circuit 50 can be comprised of circuit elements such as semiconductor switches and inverters, and therefore the driving interface circuit can be fabricated on an IC, as in the first embodiment.

Embodiment 3

A third embodiment of the invention will be described with reference to FIG. 8.

Figure 8:
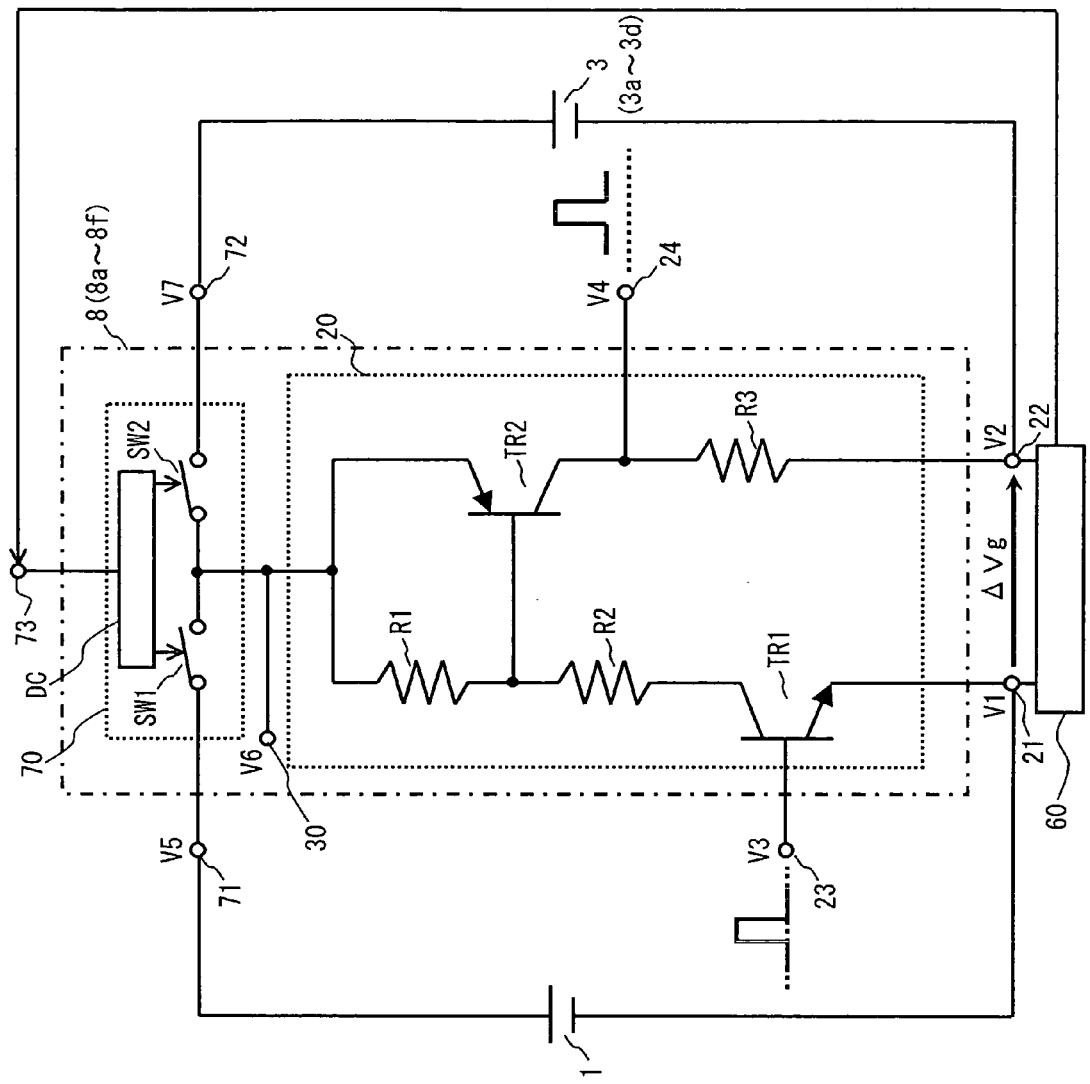
FIG. 8 shows a circuit diagram of a driving interface circuit according to a third embodiment of the invention.

FIG. 8 shows the circuit configuration of driving interface circuits 8 (u-phase, v-phase, and w-phase upper-arm driving interface circuits 8a, 8b, and 8c and u-phase, v-phase, and w-phase lower-arm driving interface circuits 8d, 8e, and 8f) in the present embodiment.

The present embodiment is a variation of the second embodiment and identical thereto except for the configuration of the potential selection circuit.

While the following description concerns the circuit configuration of the driving interface circuits 8 as an example, it is possible to configure an abnormality detection interface circuit by exchanging the circuit from the sixth terminal 30 to the first terminal 21 of the level shift circuit 20 (left-side of the circuit shown in FIG. 8) for the circuit from the sixth terminal 30 to the second terminal 22 thereof (right-side of the circuit shown in FIG. 8), as in the second embodiment.

A potential selection circuit 70 is an electric switching circuit that, as in the second embodiment, selects either the 5th potential V5 or the 7th potential V7 as the potential on the high-potential side of the operating power supply voltage for the level shift circuit 20, depending on the potential difference between the 1st potential V1 and the 2nd potential V2. The potential selection circuit 70 of the present embodiment is comprised of switches SW1 and SW2 electrically connected in series and a decoder DC. The switches SW1 and SW2 are semiconductor switches including transistors.

One end of the switch SW1 (opposite to the end thereof connected to the switch SW2) is electrically connected with a fifth terminal 71. One end of the switch SW2 (opposite to the end thereof connected to the switch SW1) is electrically connected with a seventh terminal 72. The connection point between the switch SW1 and the switch SW2 is electrically connected with the sixth terminal 30. To the decoder DC, there is electrically connected an input terminal 73. The decoder DC, in response to an instruction signal from a detector 60, outputs a drive signal for operating the switches SW1 and SW2. In the present embodiment, the potential selection circuit 70 is comprised of a selector circuit including a multiplexer.

As mentioned in the second embodiment, a comparator 60 determines a difference voltage $\Delta VG$ between a 1st potential V1 and a 2nd potential V2. The comparator 60 outputs a high- or on-signal if the difference voltage $\Delta VG$ satisfies the condition $\Delta VG > 0$. When the difference voltage $\Delta VG$ satisfies the condition $\Delta VG < 0$, it outputs a low- or off signal.

When the instruction signal outputted from the comparator 60 is a high- or on-signal, the decoder DC outputs a drive signal to each of the switches SW1 and SW2 so as to turn off the former and turn on the latter. As a result, the potential selection circuit 70 selects the 7th potential V7 and inputs (applies) it to the level shift circuit 20 as the operating voltage (which is the potential on the high-potential side, namely, 6th potential V6) for the level shift circuit 20. In this case, the potential difference V71 is greater than the potential difference V51.

When the instruction signal from the comparator 60 is a low signal or an off signal, the decoder DC outputs drive signals to the switches SW1 and SW2 such that the former is switched on and the latter off. As a result, the potential selection circuit 70 selects the fifth potential V5 and inputs (applies) it to the level shift circuit 20 as its operating voltage (with potential on the high-potential side, namely sixth potential V6). In this case, the potential difference V51 is greater than the potential difference V71.

Thus, in the present embodiment, the potential selection circuit 70 is operated in accordance with the instruction signal (external signal) that is based on the fluctuation in the potential difference between the 1st potential V1 and the 2nd potential V2. Accordingly, the level shift circuit 20 can be operated even when there is fluctuation in the potential difference ΔVG, as in the first embodiment.

In accordance with the present embodiment, as in the second embodiment, an interface circuit can be provided that enables signal transmission between the motor control unit MCU and the drive circuit unit DCU without employing an optical isolator and which has superior noise tolerance, reliability and heat-tolerance.

Furthermore, in accordance with the present embodiment, the potential selection circuit 50 can be comprised of circuit elements such as semiconductor switches and decoders, and therefore the driving interface circuit can be fabricated on an IC, as in the second embodiment.

Embodiment 4

A fourth embodiment of the invention will be described with reference to FIG. 9.

Figure 9:
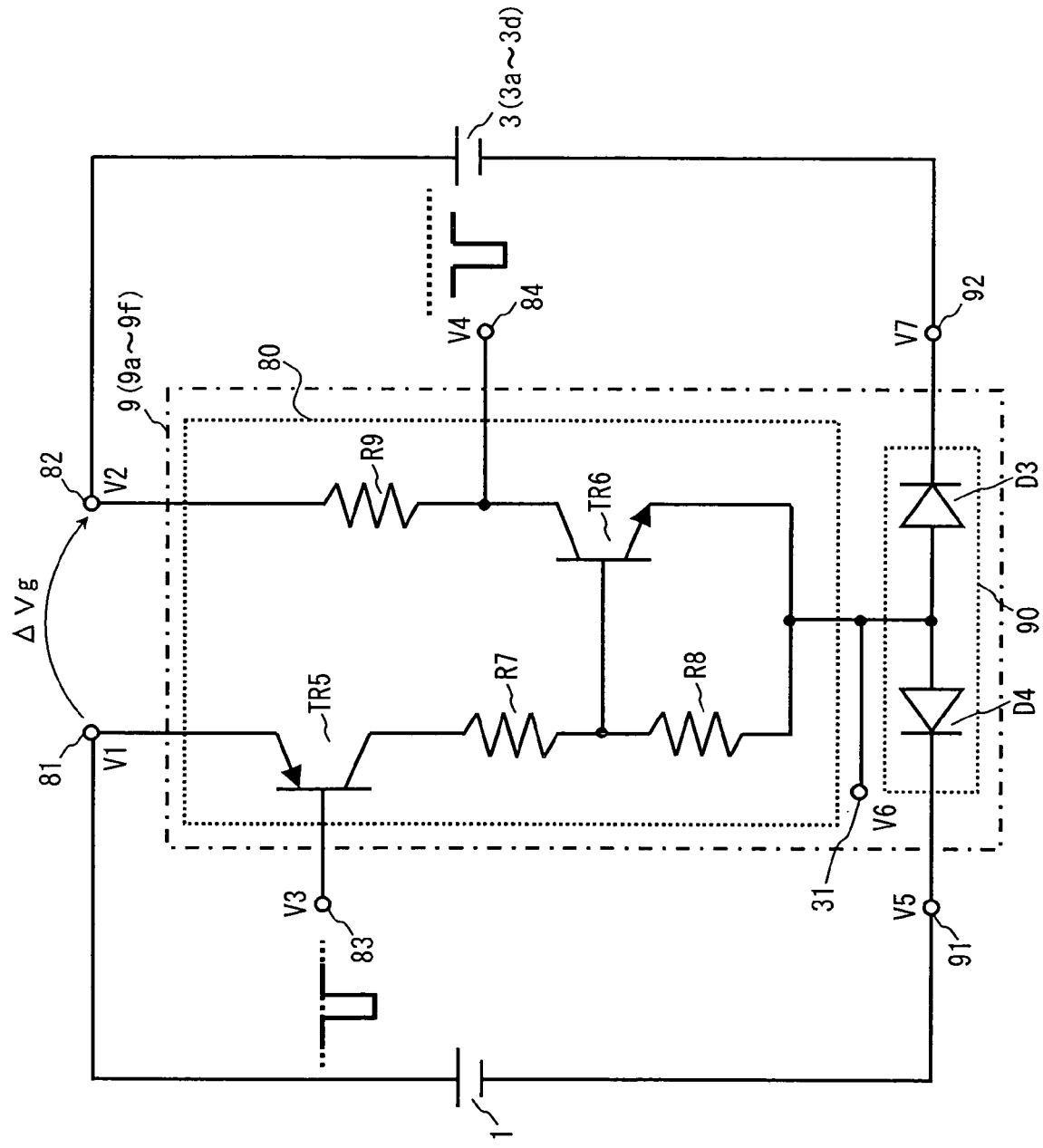
FIG. 9 shows a circuit diagram of a driving interface circuit according to a fourth embodiment of the invention.

FIG. 9 shows the circuit configuration of driving interface circuit 9 (u-phase, v-phase, and w-phase upper-arm driving interface circuits 9a, 9b, and 9c and u-phase, v-phase, and w-phase lower-arm driving interface circuits 9d, 9e, and 9f).

The foregoing description of the first to third embodiments has been made with reference to the driving interface circuits such that the reference potential of a pulse signal is on the low-potential side of the insulated power supply 1 and a pulse signal that rises with respect to the reference potential is transmitted. In the present embodiment, however, a configuration of the driving interface circuit 9 is described in which unlike the first to third embodiments the reference potential of pulse signal is on the high-potential side of the insulated power supply 1 and a pulse signal that falls with respect to the reference potential is transmitted.

The driving interface circuit 9 of the present embodiment is comprised of a potential selection circuit 90 and a level shift circuit 80, as in the first through third embodiments. However, the circuit configuration of those circuits differs from that of the first to third embodiments.

While the following description of the present embodiment is made with reference to the driving interface circuit 9, it is possible to configure an abnormality detection interface circuit by exchanging the circuit from the sixth terminal 31 to the first terminal 81 of the level shift circuit 80 (left-side of the circuit shown in FIG. 9) for the circuit from the sixth terminal 31 to the second terminal 82 thereof (right-side of the circuit shown in FIG. 9), as in the first through third embodiments.

The level shift circuit 80 is a signal transmission circuit for level-shifting the digital signal from the microcomputer 2 and transmitting the resultant signal to the gate circuits 5.

The level shift circuit 80, which is comprised of two transistor elements and three resistor elements, receives a pulse signal (control signal with pulse voltage V3 outputted from the microcomputer 2) having a 1st potential V1 (potential at the high-potential side of the insulated power supply 1) as a reference potential, and outputs a pulse signal (drive signal with pulse voltage V4 outputted to the gate circuits 5) having a 2nd potential V2 (potential at the high-potential side of the insulated power supply 3) as reference potential. The level shift circuit 80 is electrically connected with the first to fourth terminals 81 to 84 and the sixth terminal 31.

The first terminal 81 is electrically connected with the emitter electrode of a PNP transistor element TR5. The collector electrode of the PNP transistor element TR5 is electrically connected with one end of a current-limiting resistor element R7. The current-limiting resistor element R7 limits the current that flows out of the collector electrode of the PNP transistor. The other end of the current-limiting resistor element R7 (end opposite to the end connected with the collector electrode of PNP transistor element TR5) is electrically connected with one end of a drive-voltage producing resistor element R8. The drive-voltage producing resistor element R8 produces a drive voltage for driving a NPN transistor element TR6 as will be described later. The other end of the drive-voltage producing resistor element R8 (end opposite to the end connected with the current-limiting resistor element R7) is electrically connected with the emitter electrode of the NPN transistor element TR6.

The collector electrode of the NPN transistor element TR6 is electrically connected with one end of an output signal producing resistor element R9, which produces an output signal at a fourth terminal 84 as will be described later. The other end of the output signal producing resistor element R9 (end opposite to the end connected to the collector electrode of the NPN transistor element TR6) is electrically connected with a second terminal 82. The base electrode of the PNP transistor element TR5 is electrically connected with a third terminal 83.

A fourth terminal 84 is electrically connected to the point of connection between the collector electrode of the NPN transistor element TR6 and the output signal producing resistor element R9. To the point of connection between the drive-voltage producing resistor element R8 and the current-limiting resistor element R7, there is electrically connected the base electrode of the NPN transistor element TR6. To the point of connection between the emitter electrode of the NPN transistor element TR6 and the drive-voltage producing resistor element R8, there is electrically connected a sixth terminal 31.

The first terminal 81 is electrically connected with the high-potential side of the insulated power supply 1. Thus, the 1st potential V1 at the first terminal 81 is equal to the potential on the high-potential side of the insulated power supply 1. The second terminal 82 is electrically connected with the high-potential side of the insulated power supply 3. Thus, the 2nd potential V2 at the second terminal 82 is equal to the potential on the high-potential side of the insulated power supply 3.

The third terminal 83 is a control signal input terminal electrically connected to the microcomputer 2 having the potential on the high-potential side of the insulated power supply 1 as reference potential. The base electrode of the PNP transistor element TR5 receives a signal (pulse signal (pulse voltage V3) having the potential on the high-potential side of the insulated power supply 1 as reference potential)

outputted from the microcomputer 2. The PNP transistor element TR5 is switched on and off by the pulse signal (pulse voltage V3).

The fourth terminal 84 is a control signal output terminal and is electrically connected with the gate circuit 5 having the same potential as that on the high-potential side of the insulated power supply 3 as reference potential. The level shift circuit 80 outputs a pulse signal (pulse voltage V4) having the potential on the high-potential side of the insulated power supply 3 as reference potential to the gate circuit 5 having, as reference potential, a potential equal to the potential on the high-potential side of the insulated power supply 3.

The sixth terminal 31 is a low-potential side terminal of the operating power supply for the level shift circuit 80 and is electrically connected with the potential selection circuit 90. Thus, the potential at the low-potential side terminal of the operating power supply for the level shift circuit 80 is selected by the potential selection circuit 90.

The potential selection circuit 90 selects one of a plurality of different potentials as the potential on the low-potential side of the operating power supply for the level shift circuit 80. Thus, the potential selection circuit 90 can be considered to be an electric switching circuit. To the potential selection circuit 90, a fifth terminal 91 and a seventh terminal 92 and the sixth terminal 31 are electrically connected.

In one example, the potential selection circuit 90 is comprised of diode elements D3 and D4 whose anodes are electrically connected to each other. The cathode electrode of the diode element D3 is electrically connected with the 7th terminal 92. The cathode electrode of the diode element D4 is electrically connected with the 5th electrode 91. To the anode electrodes of the diode elements D3 and D4, there is electrically connected the 6th electrode 31.

The 5th electrode 91 is electrically connected with the low-potential side of the insulated power supply 1. Thus, the potential of the cathode electrode of the diode element D4 becomes equal to the potential on the low-potential side of the insulated power supply 1. The 7th electrode 92 is electrically connected with the low-potential side of the insulated power supply 3. Thus, the potential of the cathode electrode of the diode element D3 becomes equal to the potential on the low-potential side of the insulated power supply 3. The diode elements D3 and D4 select either the 5th potential V5 or the 7th potential V7 that has a greater potential difference from the reference potential, namely, 1st potential V1, as the 6th potential V6. As a result, the potential selection circuit 90 inputs (applies) either the 5th potential V5 or the 7th potential V7 to the low-potential side (6th terminal 31) of the operating power supply voltage for the level shift circuit 80.

While in the present embodiment two different potentials, namely, the 5th potential V5 and 7th potential V7, have been used as the input potentials to the potential selection circuit 90, three or more different potentials may be used as input potential to the potential selection circuit 90.

As an on-pulse (low-level) signal having the potential on the high-potential side (1st potential) of the insulated power supply 1 as reference potential is outputted from the microcomputer 2, the pulse signal is inputted (applied) to the base electrode of the PNP transistor element TR5 via the third terminal 83. As a result, the PNP transistor element TR5 turns on. Assuming now that the potential difference between the 5th potential V5 and the 1st potential V1 is V51, and the potential difference between the 7th potential V7 and the 1st potential V1 is V71, the potential selection circuit 90 selects either potential difference V51 or V71 that has a greater potential difference and designates it as the potential on the low-potential side of the operating power supply voltage for the level shift circuit 80.

When TR5 is on, current flows through the drive-voltage producing resistor element R8 so that an operating voltage develops across the drive-voltage producing resistor element R8 for operating (turning on) the NPN transistor element TR6. The operating voltage is inputted (applied) to the base electrode of the NPN transistor element TR6. As a result, the NPN transistor element TR6 turns on, whereby current flows through the output signal producing resistor element R9 so that an on-pulse signal is produced across the output signal producing resistor element R9, the signal having the potential on the high-potential side of the insulated power supply 3 as reference potential. The pulse signal is outputted to the gate circuits 5 with its potential level-shifted from the high-potential side of the insulated power supply 1 to the high-potential side of the insulated power supply 3.

The gate circuits 5 output a pulse signal to the gate electrode of the power semiconductor devices Mpu to Mnw in the power module PMU, using the pulse signal from the level shift circuit 80, as a final-stage drive signal. As a result, the power semiconductor devices Mpu to Mnw are turned on in accordance with the pulse signal outputted from the gate circuits 5.

As the pulse signal from the microcomputer 2 is turned off (high level), the PNP transistor element TR5 is turned off. As a result, current ceases to flow into the drive-voltage producing resistor element R8, whereby the voltage across the drive-voltage producing resistor element R8 (operating voltage for operating the NPN transistor element TR6) becomes zero and the NPN transistor element TR6 is turned off. As the NPN transistor element TR6 is turned off, the 4th potential V4 becomes equal to the 2nd potential V2 (high level), so that the pulse signal inputted to the gate electrode of the power semiconductor devices Mpu to Mnw is turned off. Thus, the power semiconductor devices Mpu to Mnw are turned off.

As described above, in accordance with the present embodiment, a pulse signal (having the potential on the low-potential side of the insulated power supply 1 as reference potential) outputted from the microcomputer 2 in the motor control unit MCU can be level-shifted into a pulse signal (having the potential on the low-potential side of the insulated power supply 3 as reference potential) that is transmitted to the gate circuits 5, without requiring an insulating means such as an optical isolator.

The level shift circuit is not limited to a bipolar transistor circuit but may be easily realized with a CMOS circuit or a BiCMOS circuit, for example.

In the following, the operation of the driving interface circuits is described on the assumption that the motor generator M/G is actually operated such that the upper-arm power semiconductor devices are turned on while the lower-arm power semiconductor devices are turned off.

An output pulse V4 in the present embodiment has the potential on the high-potential side of the insulated power supply 3 as reference potential. Therefore, when the upper-arm power semiconductor devices and the lower-arm power semiconductor devices are NMOS's, it is necessary to convert the output pulse into a pulse having the source potential of the NMOS's as reference potential in the gate circuit 5, using a polarity inverting circuit (NOT circuit), for example. When the upper-arm power semiconductor devices and the lower-arm power semiconductor devices are PMOS's, no polarity inverting circuit is necessary.

In the following, the operation of the present embodiment will be described as it is applied to the upper-arm side when the upper-arm and the lower-arm power semiconductor devices are both PMOS's. The 1st potential V1 is on the high-potential side of the insulated power supply 1 while the 2nd potential V2 is the source potential of the upper-arm power semiconductor device PMOS. On the upper-arm side, transient current flows through the upper-arm main circuit inductance 100 shown in FIG. 3 due to the switching of the power semiconductor device, thereby a voltage noise is produced. When it is assumed that, for example, the inductance value LS1 of the upper-arm main circuit inductance 100 is 10 nH, and the transient current dI/dt that flows through the upper-arm main circuit inductance 100 during switching is approximately 500 A/μs, a voltage noise of ±5 volts is produced. The voltage noise is dependent on the inductance value LS1 of the upper-arm main circuit inductance 100 and the transient current dI/dt that flows through the upper-arm main circuit inductance 100 during switching. When the value of the voltage noise is ±VL volts, the potential difference ΔVG between the 1st potential V1 and the 2nd potential V2 fluctuates within ±VL volts.

It is now assumed that the output voltage of the insulated power supply 1 is −5 V with respect to the 1st potential and the output voltage of the insulated power supply 3 is −13 V with respect to the 2nd potential. If voltage noise ±VL is produced such that the potential difference ΔVG between the 1st potential and the 2nd potential satisfies the condition ΔVG<8, the relationship between the potential difference V51 (potential difference between the 1st potential V1 and the 5th potential) and the potential difference V71 (potential difference between the 1st potential V1 and the 7th potential) would be V51>V71. Thus, the upper-arm driving interface circuit selects the 7th potential V7 (potential on the low-potential side of the insulated power supply 3) as the 6th potential V6 and inputs (applies) it to the level shift circuit 80. The 6th potential V6 that is inputted (applied) to the level shift circuit 80 is such that V6=V7=ΔVG−13+Vd. Vd is the on-voltage (approximately 0.7V) of the diodes D3 and D4 shown in FIG. 9.

If a voltage noise ±VL is produced such that the potential difference ΔVG between the 1st potential and the 2nd potential satisfies the condition ΔVG>8, the relationship between the potential difference V51 and the potential difference V71 would be V51<V71. Therefore, the upper-arm driving interface circuit selects the fifth potential V5 (potential on the low-potential side of the insulated power supply 1) as the sixth potential V6 and inputs (applies) it to the level shift circuit 20. The 6th potential V6 inputted (applied) to the level shift circuit 80 is, from the relationship of number 6, V6=V5=−5+Vd. Vd is the on-voltage (approximately 0.7V) of the diodes D3 and D4 shown in FIG. 9.

If a voltage noise ±VL is produced such that the potential difference ΔVG satisfies the condition ΔVG=8, the relationship between the potential difference V51 and the potential difference V71 would be V51=V71. Therefore, in the upper-arm driving interface circuit, the sixth potential V6 selected by the potential selection circuit 90 would be V6=V5=V7=−5+Vd. Vd is the on-voltage (approximately 0.7V) of the diodes D3 and D4 shown in FIG. 9.

When the present invention is applied to the lower-arm side, the 1st potential V1 is on the high-potential side of the insulated power supply 1, while the second potential V2 is on the source potential of the lower-arm side power semiconductor device. As the power semiconductor devices are turned on and off, the second potential changes from zero to the battery voltage VB. In this case, the potential difference ΔVG between the 1st potential V1 and the 2nd potential V2 shown in FIG. 9 is ΔVG=VB−0=VB (positive voltage). When the output voltage of the insulated power supply 1 is 5 V and that of the insulated power supply 3 is 13 V, the potential difference V51 (between 1st potential V1 and the 5th potential) would be −5 V, while the potential difference V71 (between the 1st potential and the 7th potential) would be −13 V (negative voltage). Thus, the relationship between the potential difference V51 and the potential difference V71 would be V51>V71. As a result, the upper-arm driving interface circuit selects the 7th potential (potential on the low-potential side of the insulated power supply 3) as the 6th potential V6 and inputs (applies) it to the level shift circuit 80.

Thus, the lower-arm driving interface circuit can cause the level shift circuit 80 to operate even when there is fluctuation in the potential difference ΔVG.

The control signal (pulse signal) outputted by the microcomputer 2 has its reference potential level-shifted from the 1st potential V1 to the 2nd potential V2 and is then transmitted to the gate circuit 5 on the lower-arm side as a drive signal (pulse signal). Thus, to the gate electrode of the lower-arm power semiconductor device, there is inputted (applied) the drive signal (pulse signal) outputted by the lower-arm gate circuit 5. Accordingly, the lower-arm power semiconductor device is turned on and off in accordance with the drive signal (pulse signal) outputted from the lower-arm gate circuit 5.

Thus, in accordance with the present embodiment, the driving interface circuit can be normally operated without being influenced by the steady or transient fluctuation in the potential of the source electrode of the power semiconductor devices Mpu to Mnw that is caused by the operation of the motor generator M/G. Thus, in accordance with the present embodiment, a drive interface circuit can be provided that, as in the first to third embodiments, enables signal transmission between the motor control unit MCU and the drive circuit unit DCU, which have different reference potentials, with electrically isolating them form each other without employing an optical isolator and which has superior noise tolerance, reliability and heat-tolerance.

Furthermore, in accordance with the present embodiment, because the driving interface circuit can be constructed of circuit elements such as bipolar transistors, metal-oxide semiconductor field-effect transistors, diodes, and resistors, the driving interface circuit can be fabricated as an IC. Thus, in accordance with the present embodiment, the driving interface circuits can be mounted on the same substrate together with other driving-circuit components, so that the interface circuit can be reduced in size. As a result, the inverter device INV can be reduced in size, as in the first to third embodiments.

In accordance with the present embodiment, the low-potential side of the level shift circuit 90 is selected to be either the 5th potential V5 or the 7th potential V7 that has a greater difference from the 1st potential V1, regardless of the magnitude or the algebraic sign of the potential difference ΔVG between the 1st potential V1 and the 2nd potential V2. Thus, the potential selection circuit 90 can be constructed of a simple circuit.

When the potential selection circuit 10 is constructed of the diode elements D3 and D4, as in the present embodiment, a source current flows through the 7th terminal 92 when the relationship between the potential difference V51 and the potential difference V71 is such that V51>V71. When the relationship between the potential difference V51 and the potential difference V71 is V51<V71, a source current flows through the 5th terminal 91. When the relationship between the potential difference V51 and the potential difference V71 is V51=V71, the same amount of source current flows through the 5th terminal 91 and the 7th terminal 92. Thus, by measuring the magnitude relationship between the potential difference V51 and the potential difference V71 and the current that flows through the 5th terminal 91 and the 7th terminal 92, the presence or absence of use of the interface circuit of the invention can be confirmed.

What is claimed is:

1. An interface circuit for transmitting a signal having a first potential as reference potential into a signal having a second potential as reference potential, wherein a plurality of potentials are applied as operating power supplies, said interface circuit having a first voltage inverter circuit being operated on the basis of a potential difference between one selected potential among said plurality of potentials and said first potential, and a second voltage inverter circuit being operated on the basis of a potential difference between said selected potential and said second potential and for inputting the output signal from said first voltage inverter circuit.

2. An interface circuit comprising:
a signal transmission circuit; and
an automatic potential selection circuit for automatically selecting a potential of an operating power supply voltage for said signal transmission circuit,
wherein a plurality of different potentials are applied to said automatic potential selection circuit, which selects one therefrom,
wherein a first potential, a second potential, and said selected potential are applied to said signal transmission circuit, said signal transmission circuit having a first voltage inverter circuit being operated on the basis of a potential difference between said selected potential and said first potential and a second voltage inverter circuit being operated on the basis of a potential difference between said selected potential and said second potential and for inputting the output signal from said first voltage inverter circuit, and
wherein via said first and second voltage inverter circuits, a signal having said first potential as reference is converted into a signal having said second potential as reference to be transmitted.

3. The interface circuit according to claim 2, wherein said first potential and said second potential are connected by a wire conductor.

4. The interface circuit according to claim 2, wherein said potential selection circuit and said signal transmission circuit are each comprised of a semiconductor integrated circuit.

5. The interface circuit according to claim 2, wherein said signal transmission circuit is a level shift circuit to which a signal having a first potential as reference potential is applied and which outputs a signal having a second potential as reference potential,
wherein said interface circuit is operated on the basis of both a potential difference between said selected potential and said first potential, and a potential difference between said selected potential and said second potential.

6. The interface circuit according to claim 2, wherein said potential selection circuit selects one of said plurality of potentials that has a greater potential difference from said first potential.

7. An interface circuit comprising:
a signal transmission circuit; and
a potential selection circuit for selecting a potential for the operating power supply voltage for said signal transmission circuit,
wherein a plurality of different potentials are applied to said potential selection circuit, which selects one of said plurality of potentials in response to a switch instruction signal,
wherein a first potential, a second potential, and said selected potential are applied to said signal transmission circuit, said signal transmission circuit having a first inverter circuit being operated on the basis of a potential difference between said selected potential and said first potential and a second inverter circuit being operated on the basis of a potential difference between said selected potential and said second potential and for inputting the output signal from said first voltage inverter circuit,
wherein via said first and second voltage inverter circuits, a signal having said first potential as reference potential is converted into a signal having said second potential as reference to be transmitted.

8. A semiconductor integrated circuit device comprising a signal transmission circuit between circuits having different signal reference potentials, said device having a plurality of terminals, said plurality of terminals comprising:
a first terminal having a low-potential point of a first power supply as a first potential;
a second terminal having a high-potential point of said first power supply as a second potential;
a third terminal having a low-potential point of a second power supply as a third potential;
a fourth terminal having a high-potential point of said second power supply as a fourth potential;
a fifth terminal via which a voltage signal having said first potential as reference potential is inputted;
a first voltage inverter circuit being operated on the basis of a potential difference between said first potential and said second potential and for inverting said voltage signal;
a second voltage inverter circuit being operated on the basis of a potential difference between said third potential and said fourth potential and for inverting said voltage signal outputted from said first voltage inverter circuit; and
a sixth terminal via which a voltage signal from said second voltage inverter circuit as reference potential is outputted.

9. A power conversion device for converting power fed from a power supply source into a predetermined power that is outputted, comprising:
a conversion unit having a switching semiconductor device;
a control unit for outputting a control signal for controlling the operation of said switching semiconductor device; and
a drive unit for outputting a drive signal for operating said switching semiconductor device to said conversion unit, in response to said control signal,
wherein said drive unit comprises:
a driving interface circuit responsive to said control signal; and
a drive circuit for outputting said drive signal,
wherein a plurality of different potentials are applied to said driving interface circuit, which selects one of said plurality of potentials and said driving interface circuit having a first voltage inverter circuit being operated on the basis of a potential difference between said selected potential and the reference potential of said control signal, and a second voltage inverter circuit being operated on the basis of a potential difference between said selected potential and a potential different from the reference potential of said control signal and for inputting the output signal from said first voltage inverter circuit, said driving interface circuit being adapted to output, in response to said control signal, a signal from said second voltage inverter circuit to said drive circuit, wherein said drive circuit, in response to said signal outputted from said driving interface circuit, outputs said drive signal for operating said semiconductor switching device, and wherein said conversion unit, as a result of the operation of said switching semiconductor device based on said drive signal, converts power fed from the power supply source into a predetermined power.

10. The power conversion device according to claim 9, wherein said conversion unit comprises:

a bridge circuit;

a DC terminal electrically connected with said bridge circuit; and an AC terminal electrically connected with said bridge circuit, wherein said bridge circuit is comprised of a plurality of arms each consisting of said switching semiconductor device, said plurality of arms being electrically connected in parallel between a high-potential side and a low-potential side of said DC terminal, wherein each of said plurality of arms is comprised of both said switching semiconductor device electrically connected between the high-potential side of said DC terminal and said AC terminal, and said switching semiconductor device electrically connected between the low-potential side of said DC terminal and said AC terminal, said switching semiconductor device being electrically connected in series, wherein said control unit includes a power supply for control operation having the potential on the low-potential side of said DC terminal as reference potential, wherein said drive unit comprises:

a plurality of upper-arm operating power supplies associated with each of said switching semiconductor devices disposed on the high-potential side of said plurality of arms; and a lower-arm operating power supply commonly provided for said switching semiconductor devices disposed on the low-potential side of said plurality of arms, wherein each of said plurality of upper-arm operating power supplies has the potential at said AC terminal, to which said associated switching semiconductor devices are electrically connected, as reference potential, while said lower-arm operating power supply has the potential at the low-potential side of said DC terminal as reference potential, wherein said driving interface circuit and said drive circuit are provided for and associated with each of said switching semiconductor devices, wherein said driving interface circuit associated with each of said switching semiconductor devices disposed on the high-potential side of said plurality of arms is fed with an operating power supply voltage that is either a voltage applied from said upper-arm operating power supply associated with said associated switching semiconductor device, or a voltage applied from said power supply for control operation, wherein said driving interface circuit outputs, in response to said control signal from said associated switching semiconductor device, a signal having a reference potential that is different from said received control signal to an associated one of said drive circuits, wherein said driving interface circuit, each associated with one of said switching semiconductor devices disposed on the low-potential side of said plurality of arms, selects, as an operating power supply voltage, either a voltage applied from said lower-arm operating power supply or a voltage applied from said power supply for control operation, and outputs, in response to said control signal from said associated switching semiconductor device, a signal to said associated drive circuit, said signal having a reference potential different from said received control signal.

11. The power conversion device according to claim 10, wherein said plurality of drive circuits and said plurality of driving interface circuits are integrated in a single integrated circuit semiconductor device.

12. The power conversion device according to claim 10, wherein said drive unit further comprises:

a detection circuit for detecting abnormality in said conversion unit; and an abnormality detection interface circuit for transmitting a detection signal outputted from said detection circuit to said control unit, wherein a plurality of different potentials are applied to said abnormality detection interface circuit, which selects one of said plurality of potentials and is operated on the basis of both a potential difference between said selected potential and a reference potential of the detection signal from said detection circuit, and a potential difference between said selected potential and a potential different from the reference potential of said detection signal from said detection circuit, said abnormality detection interface circuit being adapted to output, in response to said detection signal, a signal having a reference potential different from said detection signal to said control unit, wherein said control unit, in response to said detection signal from said abnormality detection interface circuit, carries out an abnormality detection process in said conversion unit.

13. The power conversion device according to claim 12, wherein said abnormality detection interface circuit and said detection circuit are provided for each of said switching semiconductor devices, wherein said abnormality detection interface circuit associated with each of said switching semiconductor devices disposed on the high-potential side of said plurality of arms is fed with an operating power supply voltage that is either a voltage applied from said upper-arm operating power supply associated with said associated switching semiconductor device, or a voltage applied from said power supply for control operation, said abnormality detection interface circuit outputting, in response to said detection signal from said associated detection circuit, a signal having a reference potential different from said received detection signal to said control unit, wherein said abnormality detection interface circuit associated with each of said switching semiconductor devices disposed on the low-potential side of said plurality of arms selects either a voltage applied from said lower-arm operating power supply or a voltage applied from said power supply for control operation as an operating power supply voltage, said abnormality detection interface circuit outputting, in response to said detection signal from said associated detection circuit, a signal having a reference potential different from said received detection signal, to said control unit.

14. The power conversion device according to claim 13, wherein said plurality of drive circuits, said plurality of driving interface circuits, and said plurality of abnormality detection interface circuits are integrated in a single integrated circuit semiconductor device.

15. A vehicle-mounted electrical machinery system for converting power fed from a vehicle-mounted power supply into an electric driving force, comprising:
an electric motor for generating electric driving force; and
a power conversion device for controlling the power fed from said vehicle-mounted power supply and feeding it to said electric motor,
wherein said power conversion device converts power fed from said vehicle-mounted power supply into a predetermined power and feeds it to said electric motor, said power conversion device comprising:
a conversion unit having a switching semiconductor device;
a control unit for outputting a control signal for controlling the operation of said switching semiconductor device; and
a drive unit for outputting, in response to said control signal, a drive signal for operating said switching semiconductor device to said conversion unit,
wherein said drive unit comprises:
a driving interface circuit responsive to said control signal; and
a drive circuit for outputting said drive signal,
wherein a plurality of different potentials are applied to said driving interface circuit, which selects one of said plurality of potentials and said driving interface circuit having a first voltage inverter circuit being operated on the basis of a potential difference between said selected potential and a reference potential of said control signal, and a second voltage inverter circuit being operated on the basis of a potential difference between said selected potential and a potential different from the reference potential of said control signal and for inputting the output signal from said first voltage inverter circuit, said driving interface circuit being adapted to output, in response to said control signal, a signal from said second voltage inverter circuit to said drive circuit,
wherein said driving circuit, in response to said signal from said driving interface circuit, outputs said drive signal for operating said semiconductor switching device,
wherein said conversion unit converts the power fed from the vehicle-mounted power supply into a predetermined power as said switching semiconductor device is operated by said drive signal,
and wherein said electric motor generates a driving force using the power fed from said conversion unit.

16. The vehicle-mounted electric machinery system according to claim 15, wherein said conversion unit comprises:
a bridge circuit;
a DC terminal electrically connected with said bridge circuit; and
an AC terminal electrically connected with said bridge circuit,
wherein said bridge circuit is comprised of a plurality of arms each consisting of said switching semiconductor device, said plurality of arms being electrically connected in parallel between a high-potential side and a low-potential side of said DC terminal,
wherein each of said plurality of arms is comprised of an electrical series connection of said switching semiconductor device electrically connected between the high-potential side of said DC terminal and said AC terminal and said switching semiconductor device electrically connected between the low-potential side of said DC terminal and said output terminal,
wherein said control unit includes a power supply for control operation having the potential on the low-potential side of said DC terminal as reference potential,
wherein said drive unit comprises:
a plurality of upper-arm operating power supplies associated with each of said switching semiconductor devices disposed on the high-potential side of said plurality of arms; and
a lower-arm operating power supply commonly provided for said switching semiconductor devices disposed on the low-potential side of said plurality of arms,
wherein each of said plurality of upper-arm operating power supplies has the potential at said AC terminal, to which said associated switching semiconductor devices are electrically connected, as reference potential, while said lower-arm operating power supply has the potential at the low-potential side of said DC terminal as reference potential,
wherein said driving interface circuit and said drive circuit are provided for and associated with each of said switching semiconductor devices,
wherein said driving interface circuit associated with each of said switching semiconductor devices disposed on the high-potential side of said plurality of arms is fed with an operating power supply voltage that is either a voltage applied from said upper-arm operating power supply associated with said associated switching semiconductor device, or a voltage applied from said power supply for control operation,
wherein said driving interface circuit outputs, in response to said control signal from said associated switching semiconductor device, a signal having a reference potential that is different from said received control signal to an associated one of said drive circuits,
wherein said driving interface circuit, each associated with one of said switching semiconductor devices disposed on the low-potential side of said plurality of arms, selects either a voltage applied from said lower-arm operating power supply or a voltage applied from said power supply for control operation as an operating power supply voltage, and outputs, in response to said control signal from said associated switching semiconductor device, a signal to said associated drive circuit, said signal having a reference potential different from said received control signal.

17. The vehicle-mounted electric machinery system according to claim 16, wherein said plurality of drive circuits and said plurality of driving interface circuits are integrated in a single integrated circuit semiconductor device.

18. The vehicle-mounted electric machinery system according to claim 15, wherein
said drive unit further comprises:
a detection circuit for detecting abnormality in said conversion unit; and an abnormality detection interface circuit for transmitting a detection signal outputted from said detection circuit to said control unit, wherein a plurality of different potentials are applied to said abnormality detection interface circuit, which selects one of said plurality of potentials and is operated on the basis of both a potential difference between said selected potential and a reference potential of the detection signal from said detection circuit, and a potential difference between said selected potential and a potential different from the reference potential of said detection signal from said detection circuit, said abnormality detection interface circuit being adapted to output, in response to said detection signal from said detection circuit, a signal having a reference potential different from said detection signal to said control unit, wherein said control unit, in response to said detection signal from said abnormality detection interface circuit, carries out an abnormality detection process in said conversion unit.

19. The vehicle-mounted electric machinery system according to claim 18, wherein said abnormality detection interface circuit and said detection circuit are provided for each of said switching semiconductor devices, wherein said abnormality detection interface circuit associated with each of said switching semiconductor devices disposed on the high-potential side of said plurality of arms is fed with an operating power supply voltage that is either a voltage applied from said upper-arm operating power supply associated with said associated switching semiconductor device, or a voltage applied from said power supply for control operation, said abnormality detection interface circuit outputting, in response to said detection signal from said associated detection circuit, a signal having a reference potential different from said received detection signal to said control unit, wherein said abnormality detection interface circuit associated with each of said switching semiconductor devices disposed on the low-potential side of said plurality of arms selects either a voltage applied from said lower-arm operating power supply or a voltage applied from said power supply for control operation as an operating power supply voltage, said abnormality detection interface circuit outputting, in response to said detection signal from said associated detection circuit, a signal having a reference potential different from said received detection signal to said control unit.

* * * * *